(12) United States Patent
Rinderknecht et al.

(10) Patent No.: US 7,296,249 B2
(45) Date of Patent: Nov. 13, 2007

(54) USING CONSTRAINED SCAN CELLS TO TEST INTEGRATED CIRCUITS

(76) Inventors: Thomas Hans Rinderknecht, 8593 SW. Iroquois Dr., Tualatin, OR (US) 97062; Wu-Tung Cheng, 19030 SW. 35th Pl., Lake Oswego, OR (US) 97034

( * ) Notice: Subject to any disclaimer, the term of this patent is extended or adjusted under 35 U.S.C. 154(b) by 216 days.

(21) Appl. No.: 10/961,760

(22) Filed: Oct. 7, 2004

(65) Prior Publication Data
US 2005/0081130 A1    Apr. 14, 2005

Related U.S. Application Data

(60) Provisional application No. 60/510,641, filed on Oct. 10, 2003.

(51) Int. Cl.
*G06F 17/50* (2006.01)
*G06F 11/00* (2006.01)
*G01R 31/28* (2006.01)

(52) U.S. Cl. .................. 716/4; 714/25; 714/726; 714/738

(58) Field of Classification Search ........... 716/4–5; 714/738–739, 726–729, 25
See application file for complete search history.

(56) References Cited

U.S. PATENT DOCUMENTS

| | | | |
|---|---|---|---|
| 5,790,562 A | 8/1998 | Murray et al. | |
| 6,070,261 A | 5/2000 | Tamarapalli et al. | |
| 6,308,291 B1 | 10/2001 | Kock et al. | |
| 6,662,327 B1 * | 12/2003 | Rajski | 714/738 |
| 6,886,124 B2 * | 4/2005 | Wang | 714/738 |

OTHER PUBLICATIONS

Abramovici et al., *Digital Systems Testing and Testable Design*, Computer Science Press, pp. 226-235, 460-461 (1990).
Bardell et al., *Built-In Test for VLSI: Pseudorandom Techniques*, John Wiley & Sons, Inc., pp. 152-155, 216-225 (1987).
Bardell et al., "Parallel Pseudorandom Sequences for Built-In Test," *Proc. ITC*, pp. 302-308 (Oct. 1984).

(Continued)

*Primary Examiner*—Paul Dinh
(74) *Attorney, Agent, or Firm*—Klarquist Sparkman, LLP

(57) ABSTRACT

Various new and non-obvious apparatus and methods for testing an integrated circuit are disclosed. In one exemplary embodiment, a control point is selected in an integrated circuit design. Scan cells in the integrated circuit design are identified that can be loaded with a set of fixed values in order to propagate a desired test value to the control point. The integrated circuit design is modified to include circuit components configured to load the scan cells in the integrated circuit design with the set of fixed values during a test phase. The one or more scan cells may be identified by justifying the control point to the scan cells, thereby determining values that the scan cells must output in order to drive the control point to the desired test value. Computer-readable media comprising computer-executable instructions for causing a computer to perform any of the disclosed methods or computer-readable design information for any of the disclosed apparatus are also disclosed.

29 Claims, 16 Drawing Sheets

OTHER PUBLICATIONS

Bardell et al., "Self-Testing of Multichip Logic Modules," *Proc. ITC*, pp. 200-204 (Nov. 1982).

Basturkmen et al., "Improved Algorithms for Constructive Multi-Phase Test Point Insertion for Scan Based BIST," *Proc. VLSID*, 8 pp. (2002).

Brglez et al., "Hardware-Based Weighted Random Pattern Generation for Boundary Scan," *Proc. ITC*, pp. 264-274 (1989).

Briers et al., "Random Pattern Testability by Fast Fault Simulation," *Proc. ITC*, pp. 274-281 (Sep. 1986).

Chatterjee et al., "A Novel Pattern Generator for Near-Perfect Fault-Coverage," *Proc. VLSI*, pp. 417-425 (1995).

Cheng et al., "Timing-Driven Test Point Insertion for Full-Scan and Partial-Scan BIST," *Proc. ITC*, pp. 506-514 (1995).

Flottes et al., "Design for Sequential Testability: An Internal State Reseeding Approach for 100% Fault Coverage," *Asian Test Symposium*, pp. 404-409 (Dec. 2000).

Hellebrand et al., "Built-In Test for Circuits with Scan Based on Reseeding of Multiple-Polynomial Linear Feedback Shift Registers," *IEEE Transactions on Computers*, vol. 44, No. 2, pp. 223-233 (Feb. 1995).

Iyengar et al., "Synthesis of Pseudo-Random Pattern Testable Designs," *Proc. ITC*, pp. 501-508 (1989).

Koenemann et al., "LFSR-Coded Test Patterns for Scan Designs," *Proc. European Test Conference*, pp. 237-242 (Apr. 10-12, 1991).

Lai et al., "Logic BIST Using Constrained Scan Cells," *VLSI Test Symposium*, 7 pp. (Apr. 25, 2004).

Muradali et al., "A New Procedure for Weighted Random Built-In Self-Test," *Proc. ITC*, pp. 660-669 (1990).

Narayanan et al., "An Efficient Scheme to Diagnose Scan Chains," *Proc. ITC*, pp. 704-713 (1997).

Pateras et al., "Cube-Contained Random Patterns and their Application to the Complete Testing of Synthesized Multi-level Circuits," *Proc. ITC*, pp. 473-482 (1991).

Pomeranz et al., "3-Weight Pseudo-Random Test Generation Based on a Deterministic Test Set for Combinational and Sequential Circuits," *IEEE Transactions on Computer-Aided Design*, vol. 12, No. 7, pp. 1050-1058 (Jul. 1993).

Rudnick et al., "An Observability Enhancement Approach for Improved Testability and At-Speed Test," *IEEE Transactions on Computer-Aided Design*, vol. 13, No. 8, pp. 1051-1056 (Aug. 1994).

Savaria et al., "Automatic Test Point Insertion for Pseudo-Random Testing," *Proc. of International Symposium on Circuits and Systems*, pp. 1960-1963 (1991).

Tamarapalli et al., "Constructive Multi-Phase Test Point Insertion for Scan-Based BIST," *Proc. ITC*, pp. 649-658 (1996).

Touba et al., "Altering a Pseudo-Random Bit Sequence for Scan-Based BIST," *Proc. ITC*, pp. 167-175 (1996).

Touba et al., "Test Point Insertion Based on Path Tracing," *Proc. VLSI*, pp. 2-8 (1996).

Touba et al., "Transformed Pseudo-Random Patterns for BIST," *Proc. VLSI*, pp. 410-416 (1995).

Waicukauski et al., "A method for generating weighted random test patterns," *IBM J. Res. Develop.*, vol. 33, No. 2, pp. 149-161 (Mar. 1989).

Wunderlich, "Multiple Distributions for Biased Random Test Patterns," *Proc. ITC*, pp. 236-244 (1988).

Xiang et al., "Nonscan Design for Testability for Synchronous Sequential Circuits Based on Conflict Resolution," *IEEE Transactions on Computers*, vol. 52, No. 8, pp. 1063-1075 (Aug. 2003).

\* cited by examiner

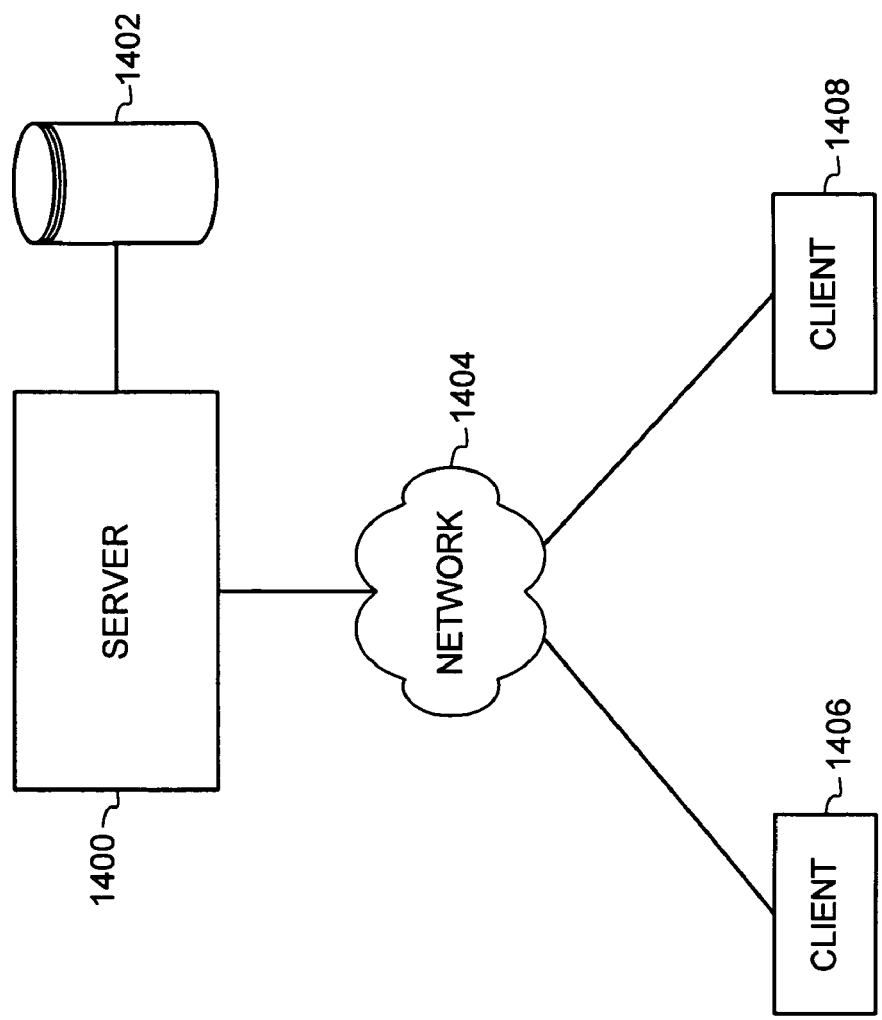

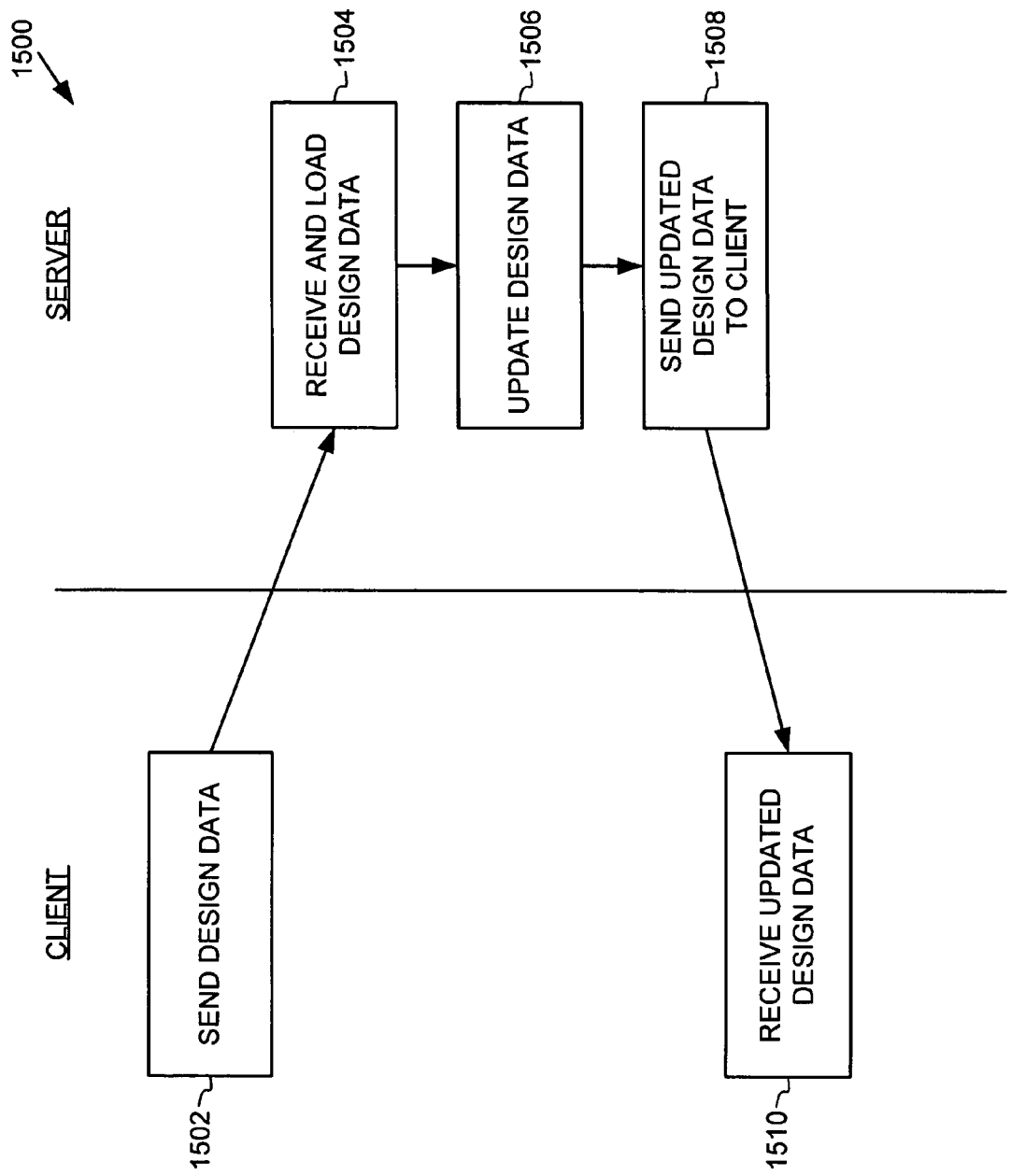

USING CONSTRAINED SCAN CELLS TO TEST INTEGRATED CIRCUITS

CROSS-REFERENCE TO RELATED APPLICATIONS

This application claims the benefit of U.S. Provisional Application No. 60/510,641, filed Oct. 10, 2003, which is hereby incorporated by reference.

TECHNICAL FIELD

This invention relates generally to the testing of circuits for faults. More particularly, this invention relates to a method and apparatus for constraining scan cells in a circuit under test to improve its testability.

BACKGROUND

The very large scale integrated (VLSI) circuits fabricated today typically contain hundreds of thousands of circuit elements. Testing these complex circuits to isolate faulty circuits from fault-free circuits has become increasingly difficult because of the inaccessibility of internal circuit elements and the elements' interdependencies. Furthermore, as the number of possible test paths through a circuit rises at $2^n$, where n is the number of circuit elements, efficient testing will continue to increase in difficulty as the density of these circuits continues to grow.

To test a circuit, a set of test vectors, or patterns, must be developed. The circuit is simulated without faults and the test patterns are applied to determine the circuit's expected response to the patterns at its primary outputs. The circuit is then simulated with faults and the test patterns again applied to determine if there is a change in the expected response to any pattern at the outputs. A fault that does not cause a change in the expected (fault free) response is an undetected fault. A test procedure desirably detects a high percentage of faults, and thus should have a minimum of undetected faults.

One common method of developing tests employs external automated test equipment (ATE). In this method, an automatic test pattern generator (ATPG) is used which, given a circuit and fault model, generates a set of test patterns designed to detect close to 100% of the circuit's faults. These deterministic test patterns are then compressed and stored in a tester. During testing, they are decompressed and loaded into the primary inputs of the circuit under test (CUT). Faults are detected by comparing the response of the circuit to the expected response. Although deterministic ATPG can detect close to 100% of faults, it requires enormous resources to generate and store the test patterns required for complex VLSI circuits. Furthermore, interactions between the external tester and elements in the CUT create their own set of potential errors.

To counter these problems, built-in self-test (BIST) methods have been developed that move the test pattern generation and output response analysis from an external source onto the chip itself. The core of the BIST technology is that rather than using a defined set of test patterns specifically defined to detect a known set of faults, a pseudo-random pattern generator (PRPG), generally a linear feedback shift register (LFSR), on the chip itself generates pseudo-random patterns which are then used to detect faults. On-chip output response analysis is typically performed by a multiple-input-shift-register (MISR), a circuit that compacts the output response and generates a signature for comparison with the signature of a fault-free circuit.

Although pseudo-random pattern generation is simple, this method rarely achieves the close-to 100% fault detection achieved by ATPG, as there are almost always faults that require very specific patterns to test; these patterns often take many, many cycles to be automatically generated, thereby elevating the cost of test application and fault simulation beyond acceptable levels.

To tackle the problem of pseudo-random-pattern resistance, many techniques have been proposed, which, generally speaking, can be classified into two categories: changing the attributes of the pseudo-random patterns, or physically modifying the CUT.

The first category consists of techniques for modifying the pseudo-random patterns to provide better fault coverage. Some of these modification methods include reseeding, weighted random testing, and pattern mapping. In reseeding, deterministic test patterns are compressed and encoded as seeds for a PRPG. These seeds then generate test patterns known to find otherwise-undetectable faults. Weighted random testing uses mathematical methods to tweak the pseudo-random patterns in ways that bias them toward detecting random-pattern-resistant faults by assigning weights to the values contained in specific scan cells, biasing their values towards "1" or "0". Pattern mapping takes the set of patterns generated by the PRPG and transforms them, using on-chip logic, into a new set of deterministic patterns that provides the desired fault coverage. However, these methods are significantly more complicated than simple random pattern generation and either require extra memory to store the seeds or weight sets, or require additional logic, all of which is expensive in terms of area overhead.

Another way of improving random pattern testability is through physical modification of the CUT. Test points, which include observation and control points, are inserted at selected nodes of the CUT. A control point—which forces a specific location in the circuit under test to a particular signal value—an test for known undetected faults at a node (e.g., a logic gate), and can also test for otherwise undetectable faults in the node's fanout cone. A control point is typically inserted by adding logic to the circuit. An observation point allows faults to be tested that do not propagate to a CUT output, but can be observed at a specific location within the CUT logic. Observation points—typically inserted by adding an additional output lead from the node—improve the observability both of the output of an internal node and nodes in its fanin cone.

One such method of selecting and inserting test points, multi-phase test point insertion (MTPI), partitions the testing into multiple phases, in which each phase includes testing for a progressively reduced set of faults. In the first phase, observation points are selected to capture the detectable faults. Within each subsequent phase, a set of control points are selected that, when added to the CUT logic, can find still-undetected faults. While observation points help improve fault coverage, control points can cause complicated changes in the circuit that may not always improve the fault coverage and that also may cause timing degradations due to the additional logic inserted into critical paths of the core logic of the CUT.

SUMMARY

Various new and non-obvious apparatus and methods for testing an integrated circuit using modified scan cells are disclosed. The disclosed exemplary apparatus and methods should not be construed as limiting in any way. Instead, the present disclosure is directed toward novel and non-obvious features and aspects of the various disclosed embodiments, alone and in various combinations and subcombinations with one another. The apparatus and methods are not limited to any specific aspect, feature, or combinations thereof, nor do the disclosed apparatus and methods require that any one or more specific advantages be present or problems be solved.

In one disclosed embodiment, a control point is selected in an integrated circuit design. One or more scan cells in the integrated circuit design are identified that can be loaded with a set of fixed values in order to propagate a desired test value to the control point. The integrated circuit design is modified to include circuit components configured to load the scan cells in the integrated circuit design with the set of fixed values during a test phase. In certain implementations, the functional paths of the integrated circuit design are unchanged after the modification. The one or more scan cells may be identified by justifying the control point to one or more scan cells, thereby determining values that the scan cells must output in order to drive the control point to the desired test value. In some implementations, a control point can be selected by performing a probabilistic fault simulation of the integrated circuit design, identifying one or more nodes in the integrated circuit design where fault coverage is below a selected threshold, and designating an output of one of the identified nodes as the control point. The set of fixed value with which the one or more scan cells can be loaded is termed a justification cube. In some implementations, the method may further includes identifying multiple justification cube candidates for propagating the desire value to the control point, calculating a performance parameter for a selected justification cube candidate (the performance parameter being indicative of the fault detection probability of the selected justification cube), and evaluating the justification cube candidate based at least in part on the performance parameter. The performance parameter may be calculated, for example, by obtaining a signal and pattern probability associated with the selected justification cube candidate (e.g., by simulating faults in the integrated circuit design while applying the justification cube candidate to corresponding scan cells), using the signal and pattern probability to obtain a propagation profile indicative of the selected justification cube candidate's ability to locate faults, and calculating the performance parameter using the propagation profile. In certain implementations, if a justification-cube candidate overlaps a previously chosen justification cube candidate, it is discarded. The method may further include identifying at least one observation point (a point in the integrated circuit design having a value indicative of the existence of a downstream fault) in the integrated circuit design.

In another embodiment, a method of testing an integrated circuit is disclosed. In this embodiment, a test pattern is shifted into a scan chain comprising multiple scan cells, and, during a portion of the period of clock cycles, the inputs of one or more scan cells in the scan chain are overridden to load a set of known values into the scan chain, thereby modifying the test pattern. The modified test pattern may be launched into the logic of the integrated circuit, thereby provoking a targeted fault at a control point. In some implementations, the act of overriding the inputs of the one or more scan cells is triggered by a signal generated on the integrated circuit (e.g., from a phase decoder on the integrated circuit). Furthermore, the overriding can be executed at least partially by logic coupled to the inputs of one or more of the scan cells. In some embodiments, the portion of the period of clock cycles when the scan cells are overridden is the last clock cycle of the period.

Another of the disclosed embodiments is a scan cell used for testing logic in an integrated circuit. The scan cell of this embodiment comprises a clocked element (e.g., a flip-flop) that inputs test-pattern data from a test-pattern-input path during a scan mode and inputs system data on a system-data path during an operational mode, respectively. The scan cell also comprises test logic having an output coupled to the test-pattern-input path and having inputs coupled to a scan path and one or more scan-override paths. In this embodiment, the value on at least one of the scan override paths controls the value on the test-pattern input path and is at least partially determined by test hardware (e.g., a phase decoder and shift counter) located on the integrated circuit. The clocked element may be further configured to output data on a downstream functional path whose timing is unaffected by the test logic. In some implementations, the test logic is configured to output a logic high value or a logic low value on the test-pattern-input path when a scan-override path has a logic high value.

Another disclosed embodiment is a method for designing a built-in self-test (BIST) architecture for a circuit under test (CUT). In this embodiment, faults are simulated within the CUT (e.g., faults undetected by pseudo-random patterns), and a control point candidate within the logic of the CUT is identified which has a threshold probability of provoking a target fault when it has a specific logic value. The control point candidate is justified to a corresponding set of one or more scan cells in the CUT. The act of justifying comprises determining the values that the corresponding set of one or more scan cells should output to force the control point candidate to the specific logic value. The justified control point candidate is evaluated with respect to other justified control point candidates, and, based at least in part on the evaluation, at least one scan cell within the CUT is assigned to be a constrained scan cell. The constrained scan cell can be configured to input a set value during a predetermined test phase. The method may further include selecting one or more observation points within the logic of the CUT.

Another embodiment is a circuit which comprises circuit logic and one or more scan chains. The scan chains are coupled to the circuit logic and are operable in at least two modes: a scan mode and an operational mode. This embodiment additionally comprises test logic that is coupled to a scan path of at least one scan cell and that is configured to load the scan cells with either a fixed value or a pseudo-random value during the scan mode. In certain implementations, the test logic is not directly coupled to the circuit logic. The circuit may also include a pseudo-random pattern generator (e.g., a linear feedback shift register (LFSR)) coupled to the test logic, which produces the pseudo-random value. In certain implementations, the circuit also comprises a phase decoder which is coupled to the test logic and which at least partially produces the fixed value. In these implementations, the circuit may also have a shift counter which has an output signal that is logically coupled with an output signal of the phase decoder, the shift counter being configured to control when the fixed value is loaded by the test logic into one of the scan cells. The shift counter may be configured, for example, to load the fixed value during a last shift cycle of the scan mode. The circuit may also include an observation point in the circuit logic, the observation point having a value indicative of the presence of a fault whose value does not otherwise propagate to circuit logic outputs.

Any of the disclosed apparatus or methods may be designed or performed by a computer program, such as an electronic-design-automation (EDA) software tool comprising computer-executable instructions stored on a computer-readable medium. Further, any of the disclosed apparatus (or apparatus designed by the disclosed methods) can be stored as circuit design information that is stored on a computer-readable medium. The circuit design information can be included in one or more data structures or design databases that are updated or modified (e.g., on a single computer or via a network). Accordingly, updated or modified data structures or design databases storing circuit design information for any of the disclosed apparatus are also disclosed.

The foregoing and additional features and advantages of the disclosed embodiments will become more apparent from the following detailed description, which proceeds with reference to the following drawings.

BRIEF DESCRIPTION OF THE DRAWINGS

FIG. 14 is a system diagram of a client/server network as may be used in designing and/or implementing the disclosed constrained-scan-cell architecture.

FIG. 15 is a flowchart showing the creation of a database using, for example, the network of FIG. 14.

DETAILED DESCRIPTION

I. General Considerations

Figure 1:
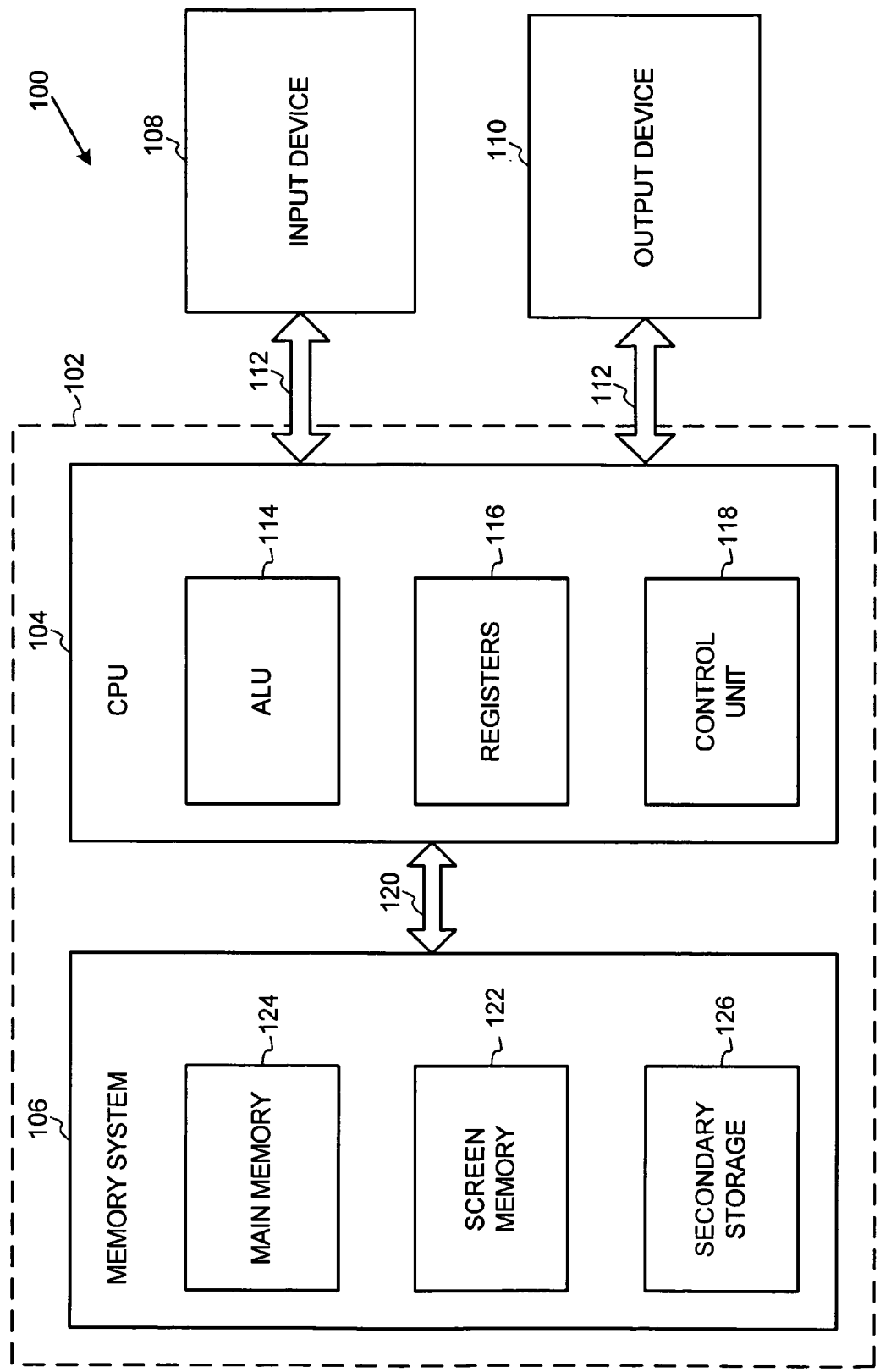
FIG. 1 is a block diagram of an exemplary computing environment as may be used in connection with the disclosed technology.

Disclosed below are representative embodiments of modified scan cells and of an on-chip testing architecture utilizing such scan cells, as well as methods for using and designing such embodiments that should not be construed as limiting in any way. Instead, the present disclosure is directed toward novel and nonobvious features and aspects of the various disclosed apparatus and methods, and their equivalents, alone and in various combinations and subcombinations with one another. The invention is not limited to any specific aspect or feature, or combination thereof, nor do the disclosed methods and apparatus require that any one or more specific advantages be present or problems be solved.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods and apparatus can be used in conjunction with other methods and apparatus. Additionally, the description sometimes uses terms like "determine" and "evaluate" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of integrated circuits or digital devices (e.g., application-specific integrated circuits (ASICs), systems-on-a-chip (SoCs), or programmable logic devices (PLDs) such as field programmable gate arrays (FPGAs), having a variety of different electrical components (e.g., digital components, analog components, or mixed-signal components).

Any of the apparatus described herein can be designed, verified, and/or simulated using software that comprises computer-executable instructions stored on one or more computer-readable media. Such software can comprise, for example, an electronic-design-automation (EDA) software tool, such as a design, verification, or simulation tool. Similarly, any of the methods described herein (e.g., constrained-scan cell selection, or testing using constrained scan cells) can be performed using software comprising computer-executable instruction stored on one or more computer-readable media. Any such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail.

Further, any of the disclosed apparatus can be stored as circuit design information on one or more computer-readable media. For example, one or more data structures or databases containing design information (e.g., a netlist or an HDL file) can be created or updated to include design information for any of the disclosed constrained-scan-cell architectures. Similarly, a data structure or database containing results from any of the disclosed constrained-scan-cell selection procedures can be created or updated and stored on one or more computer-readable media. Such data structures or databases can be created or updated at a local computer or over a network (e.g., by a server computer).

Referring to FIG. 1, an exemplary operating environment for performing embodiments of the disclosed technology is a computer system 100 with a computer 102 that comprises at least one high speed processing unit (CPU) 104, in conjunction with a memory system 106, an input device 108, and an output device 110. These elements are interconnected by at least one bus structure 112. Multiprocessor systems can also be used.

The illustrated CPU 104 is of familiar design and includes an ALU 114 for performing computations, a collection of registers 116 for temporary storage of data and instructions, and a control unit 118 for controlling operation of the system 100. The CPU 104 may be a processor having any of a variety of architectures now known or contemplated in the art.

The memory system 106 generally includes high-speed main memory 124, which has the form of a compute-readable medium such as random access memory (RAM) and read only memory (ROM) semiconductor devices, and secondary storage 126, which has the form of long-term computer-readable media such as floppy disks, hard disks, tape, CD-ROM, flash memory, and other devices that store data using electrical, magnetic, optical, or other recording media. The memory system 106 also can include video display memory, also known as screen memory 122, for displaying images through a display device. Those skilled in the art will recognize that the memory system 106 can comprise a variety of alternative components having a variety of storage capacities.

The input and output devices 108, 110 also are familiar. The input device 108 can comprise a keyboard, a mouse, a physical transducer (e.g., a microphone) and the like. The output device 110 can comprise a display, a printer, a transducer (e.g., a speaker), and the like. Some devices, such as a network interface or a modem, can be used as input and/or output devices.

As is known to those skilled in the art, the computer system 100 further includes an operating system and at least one application program. The operating system is the set of software which controls the computer system's operation and the allocation of resources. The application program is the set of software that performs a task desired by the user, using computer resources made available through the operating system. Both are resident in the illustrated memory system 106.

In accordance with the practices of persons skilled in the art of computer programming, aspects of the disclosed technology are described below with reference to acts and symbolic representations of operations that are performed by the computer system 100, unless indicated otherwise. Such acts and operations are referred to as being computer-executed or computer-implemented. It will be appreciated that the acts and symbolically represented operations include the manipulation by the CPU 104 of electrical signals representing data bits. This manipulation causes a resulting transformation or reduction of the electrical signal representation of data bits at memory locations in memory system 106 to thereby reconfigure or otherwise alter the computer system's operation, as well as other processing of signals. The memory locations where data bits are maintained are physical locations that have particular electrical, magnetic, or optical properties corresponding to the data bits.

II. The MTPI Architecture in General

Figure 2:
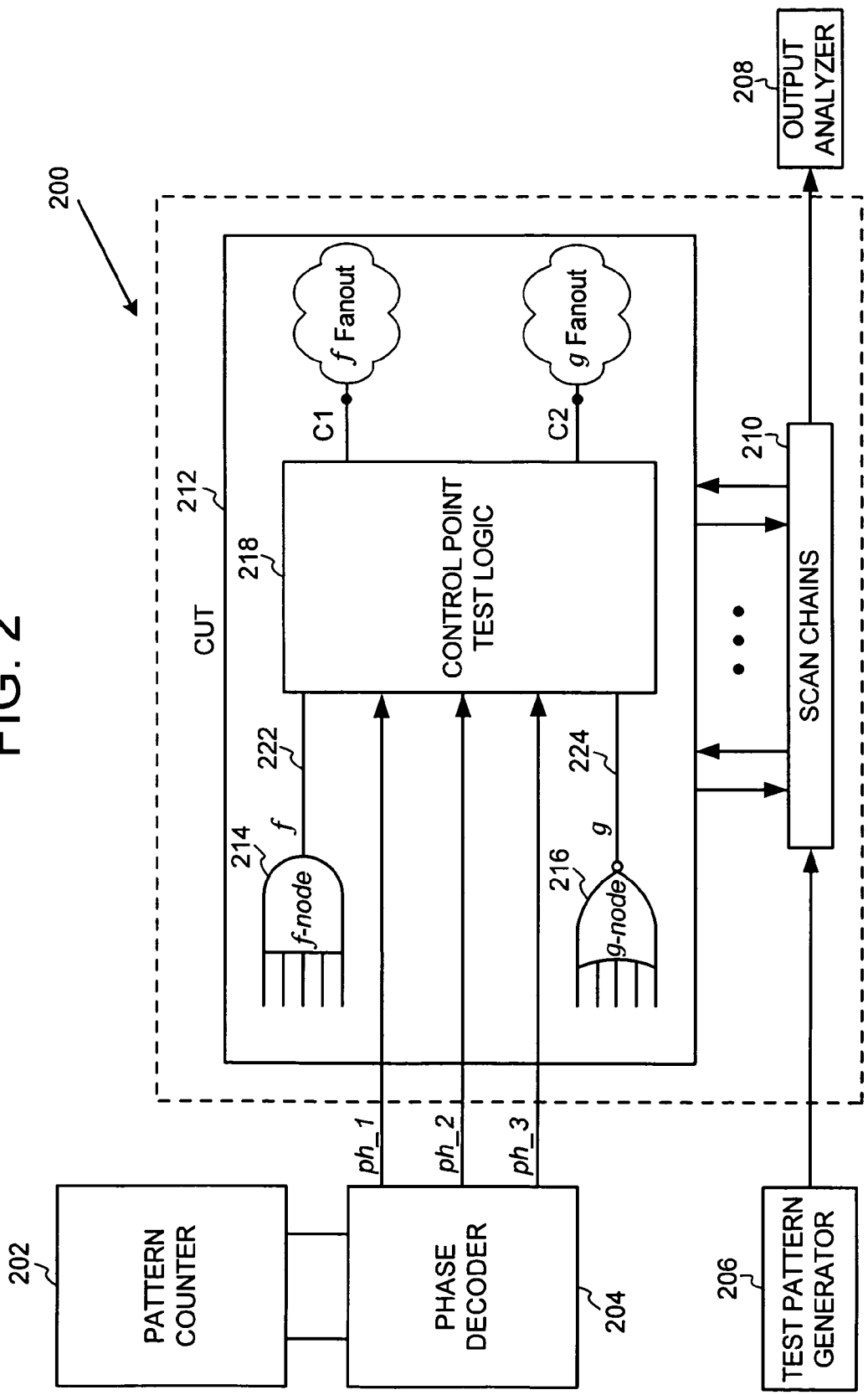
FIG. 2 is a block diagram illustrating a conventional multi-phase test point insertion (MTPI) architecture.

FIG. 2 illustrates a portion 200 of a circuit utilizing a conventional multi-phase test point insertion (MTPI) architecture. The illustrated MTPI architecture typically includes a test pattern generator 206, an output response analyzer 208, a phase decoder 204, and a pattern counter 202. The test pattern generator 206 generates pseudo-random test patterns that are fed into one or more scan chains 210. A common test pattern generator is a linear feedback shift register (LFSR). These test patterns are then fed into the combinational logic of the circuit under test (CUT) 212. The output response analyzer 208 (such as a multiple-input-shift-register (MISR) and related circuitry) analyzes the responses of the combinational logic to the test patterns to detect faults within the CUT 212. The applied test patterns are counted by the pattern counter 202. The phase decoder 204 responds to specified counts of the pattern counter 202 by generating a phase signal at its output which is applied to control point test logic 218 inserted into to the CUT 212 and which serves to drive the control points C1 and C2 to a fixed value during one or more test phases.

The phase decoder 204 generates a number of non-overlapping phase-control signals which corresponds to the number of test phases used by the CUT during testing. The illustrated embodiment shows a four-phase system with three non-overlapping signals. At phase 0 of this example, all outputs are held low so that no control point is activated. For phases 1 through 3, one of the phase-control signals (ph_1, ph_2, or ph_3, respectively) is held high in order to enable the corresponding control points for that phase. Each phase thus enables a specific set of control points, changing the pseudo-random patterns in different ways and allowing different sets of faults to be detected.

In general, MTPI attempts to improve random pattern testability by placing constant-value control points on a selected set of nodes with extremely low or high signal probability. Signal probability can be defined as the probability that a node output assumes the value "1" during random testing. A node can be thought of as a logical unit—for example, it may be one gate, or it may be several gates grouped together with a single output. For a node with extremely low signal probability—those that hold the value "0" for the majority of the applied pseudo-random patterns—an OR gate can be used to force its output value to "1"; likewise, an AND gate and an inverter can be used to force the output of an extremely high signal probability node to the value "0". In the illustrated embodiment a first node 214 (f_node) and a second node 216 (g_node) produce a first signal 222 (f) and a second signal 224 (g), respectively, which are input into the control point logic 218, where they are coupled with the phase-control signals ph_1, ph_2, and ph_3.

Figure 3:
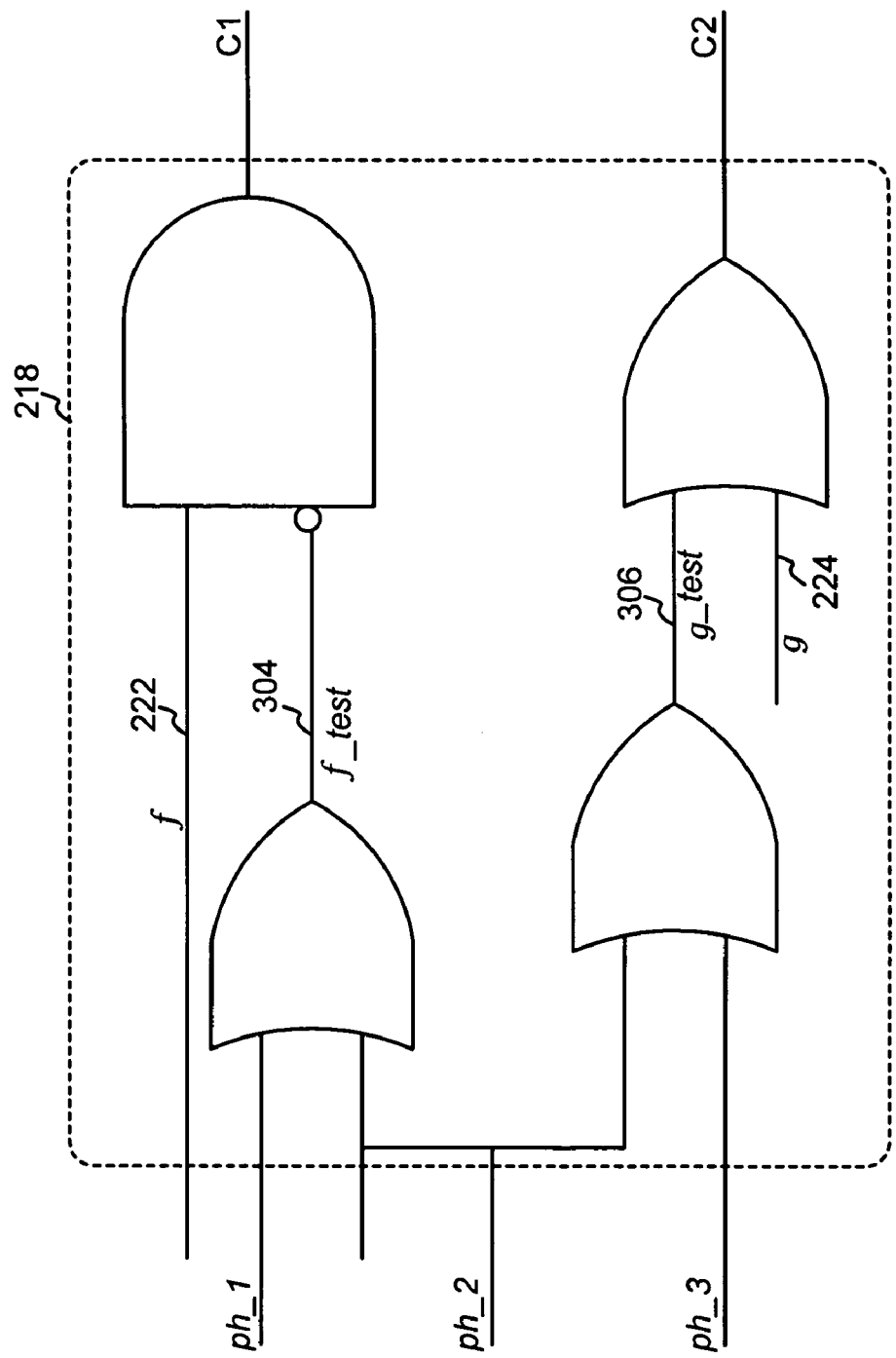
FIG. 3 is a block diagram illustrating a conventional control point implementation.

FIG. 3 is a schematic block diagram showing one exemplary configuration for the control point test logic 218 shown in FIG. 2. In the exemplary control point test logic 218, the signal f from the node f_node is ANDed with the inverse value of test signal 304 (f_test), which is produced by ORing phase-control signal ph_1 and ph_2 produced by the phase decoder 204. The value of f_test is "1" during test phases 1 and 2, forcing the control point C1 to have the value "0" no matter what the value of f. However, during test phases 0 and 3 the value of f_test is "0", so f's value is passed unchanged to control point C1. A similar analysis shows that the value of test signal 308 (g_test) is "1" during test phases 2 and 3, forcing the value of C2 to "1" regardless of g's value. During test phases 0 and 1, g_test is "0", allowing g's value to reach C2 unchanged. Observation points (not shown) can be implemented as additional fan-outs of the node being observed. Such fan-outs are desirably fed into an output analyzer. It should be noted that the embodiments are not limited to tests of any specific number of phases, as more or fewer phases than the four illustrated in FIG. 2 can be implemented.

In MTPI, control points and observation points are desirably selected based on probabilistic fault simulation (PFS). The objective of PFS is to determine, for each node, the list of faults that propagate to it and their associated detection probability. The information from the list of faults and the detection probability for each node may be called a node's "propagation profile." To obtain a propagation profile, logic simulation of a specified number of pseudo-random patterns can be performed to obtain a signal and pattern probability at each node. The pattern probability is a list of successive values held by the node and how long each was held. The signal probability, the percentage of time a node's output value is "1" or "0", is computed directly from the pattern probability.

Once the signal probability is obtained, the detection probability of a target fault can be determined. Specifically, for each fault on the target fault list, forward-fault propagation, initially using the corresponding signal probabilities, can be performed to compute the detection probability of the fault at its fan-out region. A detection threshold is specified such that once a detection probability is lower than the detection threshold, the fault stops propagating forward. The probabilities of detecting faults in the target fault list that reach primary outputs, scan cells, or observation points can be summed up to define a criteria called "BPC" (benefit per cost), which indicates the detectability of the target faults on the target fault list.

In MTPI, observation points are desirably selected during the first test phase, called here phase 0, and are preferably enabled through all phases of a test. According to one approach, fault simulation of pseudo-random patterns is run first to exclude easy-to-detect faults. Probabilistic fault simulation is then performed to develop an undetected-fault list. Thus, each node is desirably associated with a list of undetected faults and its detection probabilities. A set-covering method may then be applied to determine the set of nodes that can capture the fault effects for a desired number, and more preferably a maximal number, of undetected faults. These nodes may then serve as observation points through all test phases.

At each of the following phases, in one MTPI embodiment, control points are selected sequentially. For example, probabilistic fault simulation may be performed to obtain a propagation profile. Control-point candidates may then be determined by computing estimates E0/E1 for 1/0-failing nodes. A 1/0-failing-node category may be assigned to any one or more nodes with extreme-low or extreme-high signal probability. Estimates E0/E1 may denote the estimated number of faults that can be perturbed by virtually inserting a control point at a 1/0-failing node. In this exemplary approach, the 1/0-failing nodes with estimates E0/E1 greater than a minimum acceptable value are identified as control-point candidates. The benefit of each control-point candidate can then be computed. The best candidate is desirably selected and inserted into the netlist. One or more additional iterations of control-point selection may be performed. Iterations may be continued until a desired fault coverage is achieved or an abort limit reached.

By carefully picking test points, MTPI can achieve close to ATPG stuck-at coverage with very few test points. But, when control point test logic is inserted into the body of the CUT, it can cause timing degradations due to the additional logic inserted into critical paths of the core logic of the CUT.

III. The Constrained-Scan-Cell Architecture in General

Figure 4:
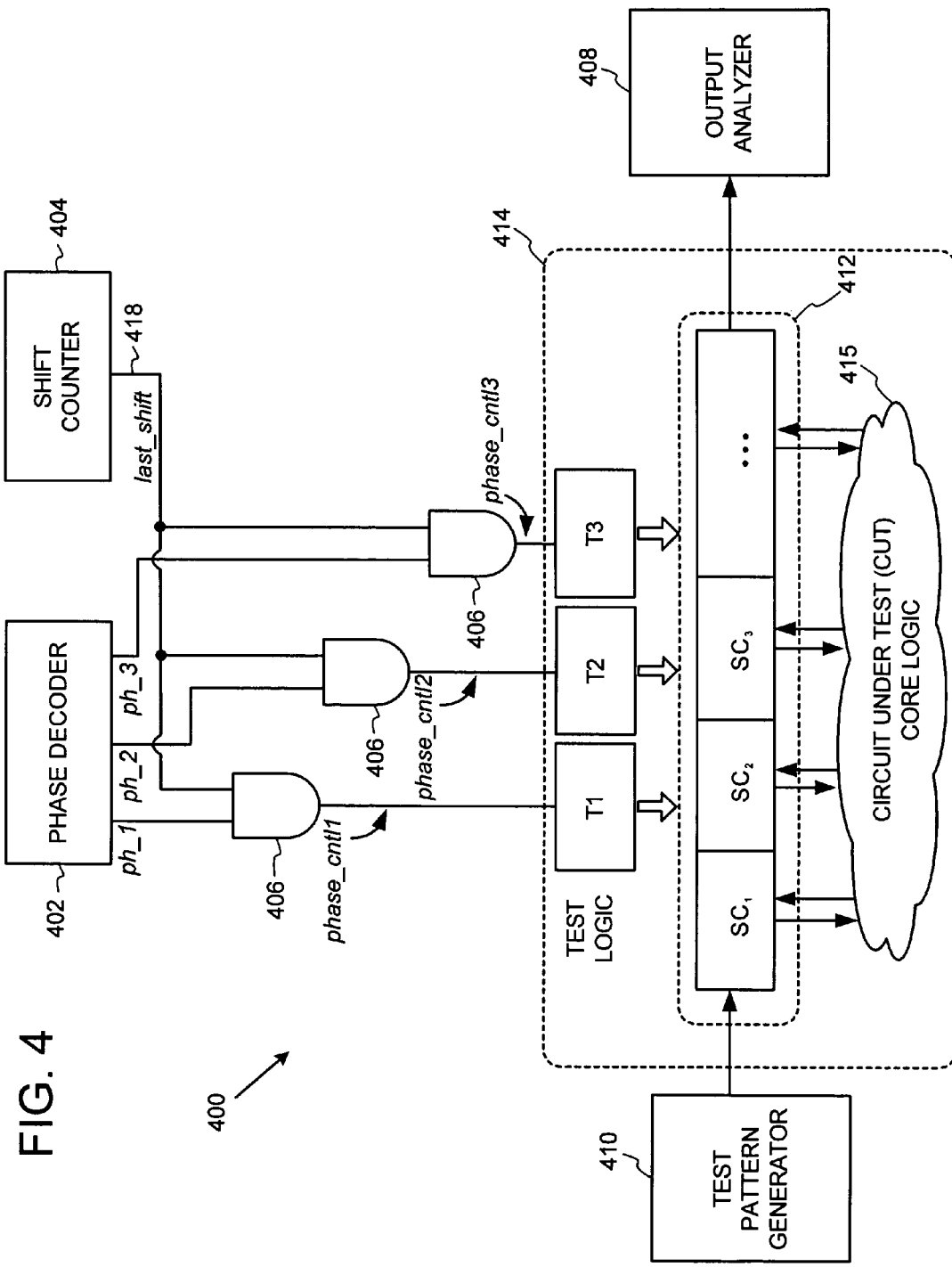
FIG. 4 is a block diagram illustrating a representative embodiment of the disclosed constrained-scan-cell architecture.

FIG. 4 is a schematic block diagram of a circuit 400 having incorporated thereon a representative embodiment of the disclosed BIST architecture. In general, the illustrated embodiment utilizes existing scan cells in the CUT 414 (which replace control points within the body of the CUT) to test pseudo-random pattern resistant faults. The exemplary architecture includes a test pattern generator 410; an output analyzer 408, which may itself incorporate a compactor or a MISR; a shift counter 404; and a phase decoder 402. The test pattern generator 410 (such as an LFSR) generates predetermined test patterns that are loaded into at least one scan chain 412 of the CUT 414. The test pattern generator 410 may incorporate methods other than straight pseudo-random generation such as reseeding, weighted random testing, or pattern mapping. The output response analyzer 408 (which might comprise one or more compactors, such as MISRs and the like) analyzes the response of the circuit logic 415 to the test patterns to detect faults within the circuit.

The scan chain 412 can be implemented according to a variety of different scan methodologies. For example, the scan chain may be part of a full-scan or partial-scan design. Further, the scan cells in the scan chain 412 may vary from implementation to implementation. In the exemplary embodiments illustrated in FIGS. 9A to 9C below, for instance, the scan cells comprise MUX-D scan cells. However, in other embodiments, other types of scan cells or combinations thereof are utilized. For example, the scan cells may comprise level sensitive scan design (LSSD) based scan cells. Such scan cells can utilize, for example, pairs of latches. Various other types and combinations of flip-flops, latches, and other such clocked elements can also be used.

The circuit 400 also includes a phase decoder 402 and a shift counter 404 whose outputs, in the illustrated embodiment, are ANDed together through gates 406 to produce unique "test phase trigger signals" (also referred to herein as "phase control signals"). When fed into test logic (T1, T2, and T3 in FIG. 4), the test phase trigger signals are used to trigger certain scan cells within the scan chain 412 such that they are loaded with a constant value during a specific test phase, thereby overwriting the test pattern from the test pattern generator 410. In the embodiment illustrated in FIG. 4, for example, the test phase trigger signals comprise phase_cntl1 for test phase 1, phase_cntl2 for test phase 2, and phase_cntl3 for test phase 3.

In the exemplary embodiment shown in FIG. 4, the test phase trigger signals are generated in part from phase decoder signals, which correspond to each test phase other than the first test phase (ph_1 for test phase 1, ph_2 for test phase 2, and ph_3 for test phase 3, the first test phase being test phase 0). Phase decoder signals ph_1, ph_2, and ph_3 are ANDed at the gates 406 with the shift counter signal 418 (last_shift) to produce the respective test phase trigger signals. Last_shift is an output signal from the shift counter 404 that, in one exemplary embodiment, is high during the last shift cycle of scan-chain loading.

Figure 5:
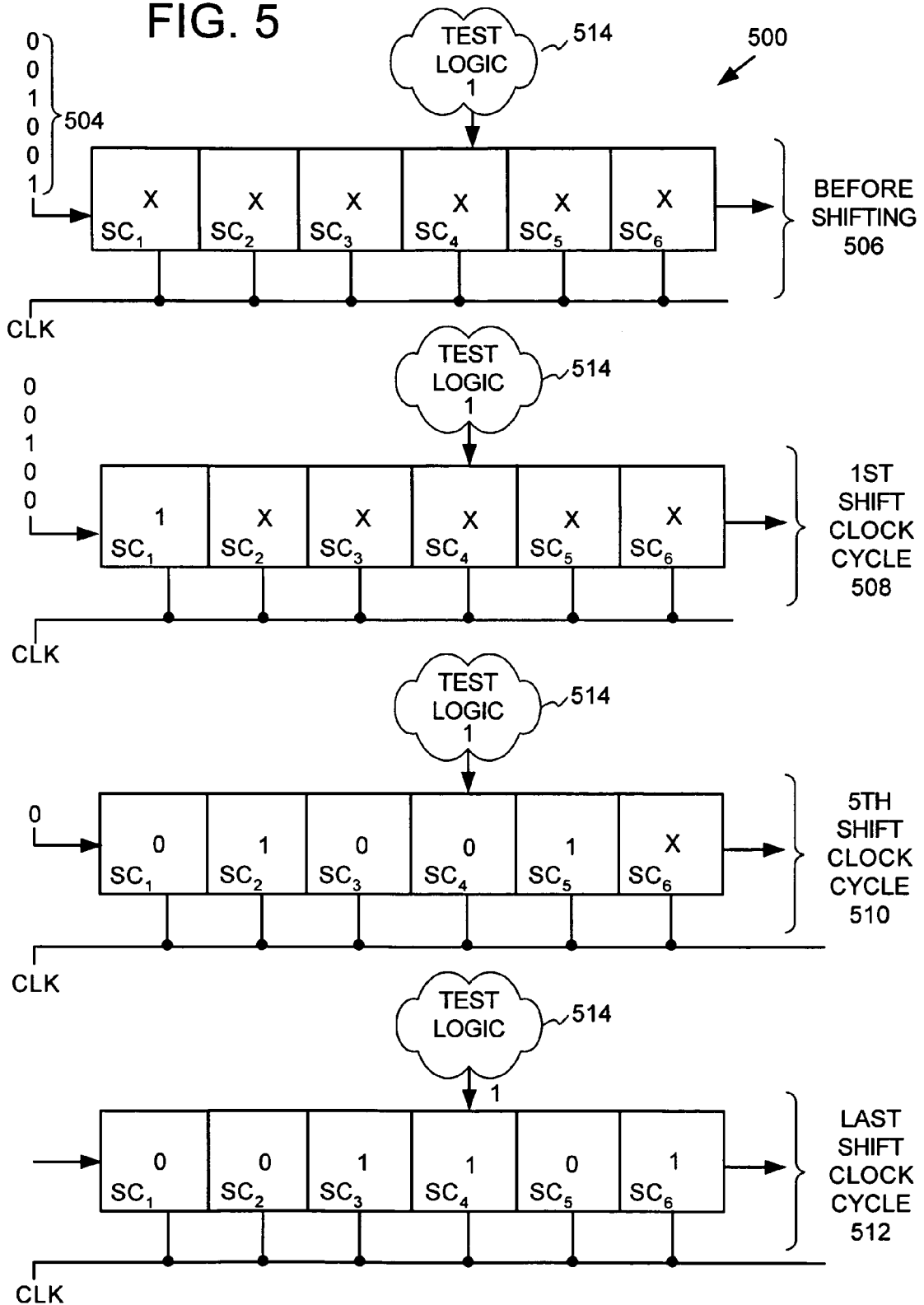
FIG. 5 is a block diagram illustrating a portion of an exemplary scan chain.
Figure 6:
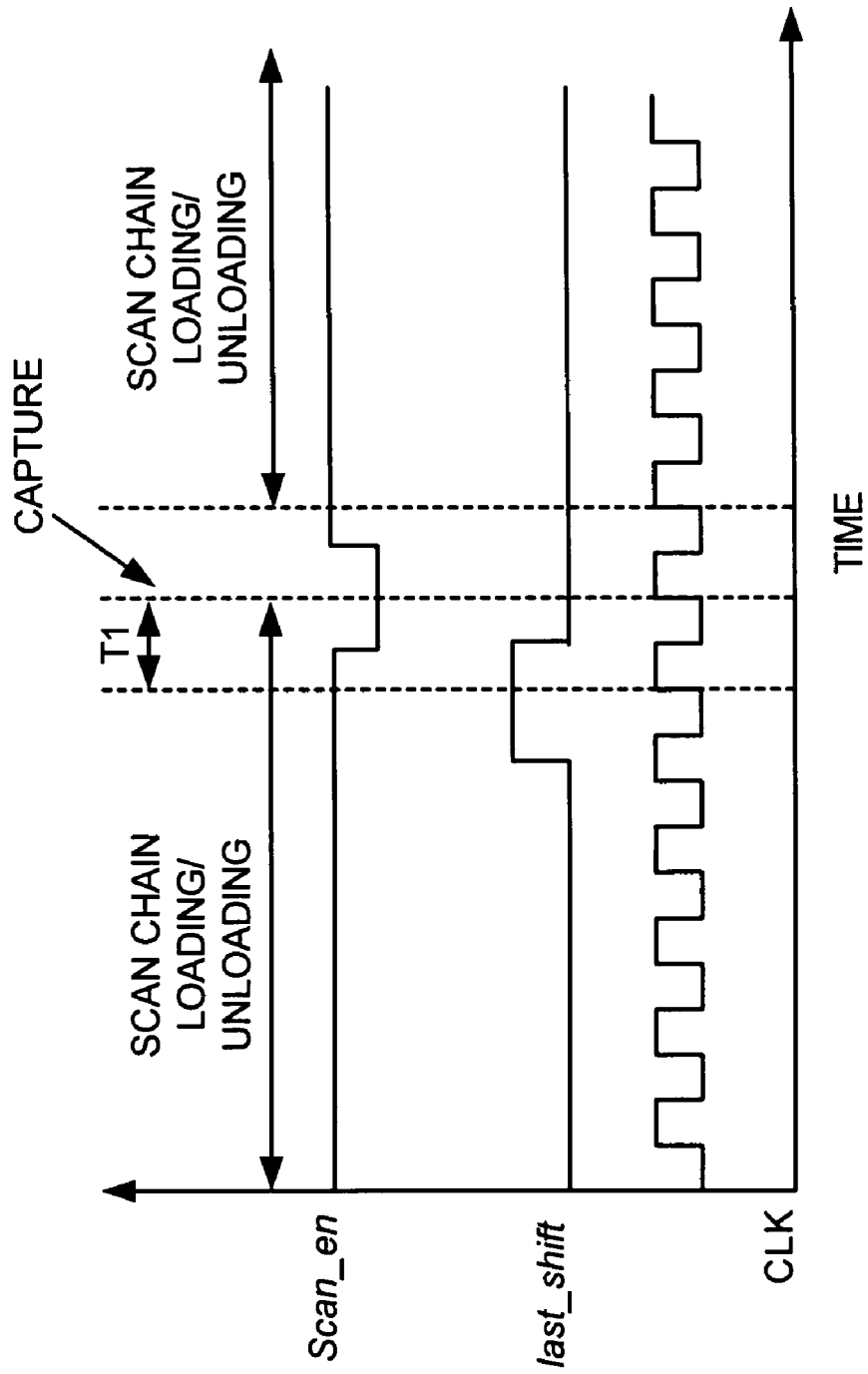
FIG. 6 is a timing diagram of output signals from an embodiment of the disclosed constrained-scan-cell architecture.

FIG. 6 shows an exemplary relationship of the last_shift signal and the system clock (CLK). In FIG. 6, last_shift is high at the rising edge of the clock cycle corresponding to the last shift cycle (shown as time period T1 in FIG. 6). Thus, as is discussed below with respect to FIG. 5, the test patterns being loaded into the scan chains of the CUT are overwritten in part by values produced by the test logic, thereby modifying the test patterns. When the modified test patterns are loaded at this last shift cycle, they are also output (or launched) by the scan chains into the functional logic of the CUT. Before the rising edge of the next clock cycle, last_shift and Scan_en are disabled. Thus, at the rising edge of the next clock cycle, the circuit response to the modified test patterns is captured within the scan cells. Scan_en is reasserted, and the circuit response is shifted out to be checked for fault conditions as the next set of test patterns are shifted in.

For the test logic to operate properly, the test phase trigger signals must reach the test logic of the constrained scan cells before the next clock cycle. To make the test phase trigger signals not timing critical, the system clock may be suppressed such that last_shift stays high for two or more clock cycles. In such embodiments, enough time exists for the test phase trigger signals to change to high and then back to low during testing without routing the test phase trigger signals as clock signals.

Because the test phase trigger signals oscillate during testing, power consumption rises somewhat. Assuming that the shift clock frequency is $f_s$ and that the maximum scan chain length is l, however, the frequency of the phase-control signal is approximately $f_s/l$, which is much lower than the shift-clock frequency. Considering that the power consumption is generally a linear function of $f^2$ (i.e., the square of frequency), the power overhead induced by the test phase trigger signals is relatively small.

In certain embodiments, the phase decoder 402 may be configured to produce the test phase trigger signals without the shift counter (e.g., counting logic may be incorporated into the phase decoder) or the phases may be triggered by some other predetermined event. Further, it should also be noted that the illustrated embodiments are not limited to any specific number of test phases, as more or fewer test phases than the four illustrated in FIG. 4 can be implemented.

IV. Exemplary Embodiments of Scan Chains Comprising Constrained Scan Cells

FIG. 5 illustrates a scan chain 500 (such as scan chain 412 from FIG. 4) that has been modified to include a constrained scan cell according to the disclosed technology. It should be understood that the six-scan-cell scan chain is simplified and for illustrative purposes only; typical scan chains contain many more scan cells and a typical CUT contain many such scan chains. As opposed to MTPI, where the phase decoder stays high for an entire test phase, in an exemplary embodiment of the disclosed technology, the phase decoder signal only stays high for the last shift cycle of scan chain loading, as explained more fully below.

Scan chains typically operate in three separate phases during BIST testing: a shift-in phase, where random test patterns are sequentially loaded into a scan chain; an operating phase, where the pattern input is shifted into core logic of the CUT, a response to the test pattern is produced in the CUT and then the response is captured within the scan chain; and a shift-out phase, where the test pattern response is shifted out to be compared with fault-free results. During the shift-in and shift-out phases (which typically occur concurrently), the scan cells of a respective scan chain are configured to be sequentially coupled to one another such that the test patterns can be clocked into and out of the scan chains in much the same fashion as a shift register. During the operating phase, the scan cells of a respective scan chain are configured to perform normally as sequential elements in a circuit design.

FIG. 5 illustrates the shift-in phase in the scan chain 500. The exemplary scan chain 500 sequentially shifts in values from a test pattern generator, one shift per clock cycle, so that the scan chain will shift six values in six clock cycles. In this example, the test pattern generator is assumed to be a PRPG (such as an LFSR). At 506, FIG. 5 shows the test pattern 504 ("0 0 1 0 0 1") before being shifted sequentially into the scan chain 500. The first test pattern value, a "1", is illustrated as being shifted into the scan chain 500 during the first clock cycle 508. After the fifth clock cycle 510, the first five cells in the scan chain have been loaded with the next test pattern value. In the illustrated embodiment, test logic 514 constrains scan cell 4 ($SC_4$) to a "1" during the last shift cycle. It can be seen that the value "0" residing in scan cell 3 ($SC_3$) after the fifth shift cycle should be shifted into $SC_4$ during the last clock cycle. However, during the last shift clock cycle 512, the test logic 514 is triggered by the test phase trigger signal at least partially determined by the phase decoder. Consequently, the constrained value "1" is loaded into $SC_4$ during the last shift cycle 512, overriding the "0" from the test pattern generator. During this clock cycle, the scan chain 500 launches the modified test pattern ("1 0 1 1 0 0" in the example shown) into the logic of the circuit under test, thereby provoking at least one previously undetected fault.

In other embodiments, the phase decoder logic may shift the constrained value into a set scan cell (such as scan cell 1) at a different clock cycle during the shift-in phase. For example, a constrained value ("1" or "0") could be shifted into the scan cell 1 at the fifth clock cycle, and then shifted into scan cell 2 during the sixth and final clock cycle, overriding the test pattern value in the second scan cell. Such variations in when the constrained value is loaded may reduce the overhead required to implement the constrained scan cells in a particular circuit design.

Figure 8:
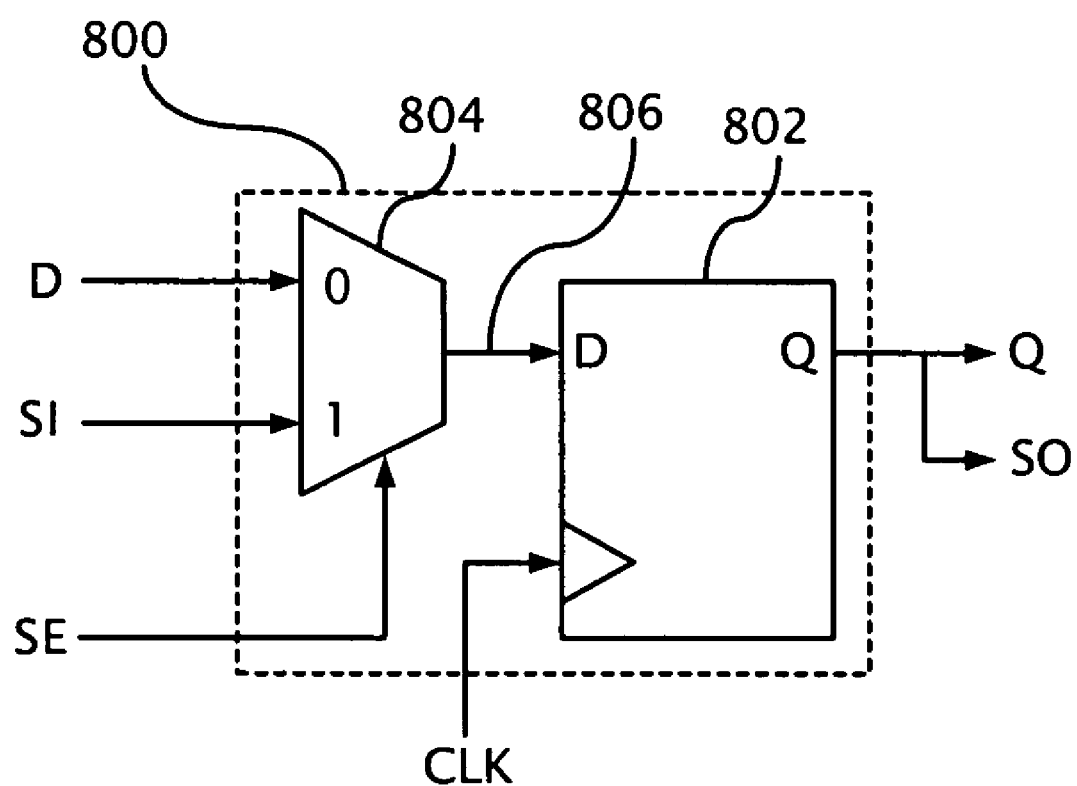
FIG. 8 is a block diagram illustrating a conventional scan cell

FIG. 8 illustrates a conventional, unmodified scan cell 800 as can be used in a scan chain (such as scan chain 412 or 500). The scan cell 800 comprises a sequential element 802 (e.g. a flip-flop or latch) with a multiplexer 804 placed in a data-input path 806 coupled to the sequential element's input (e.g., the D input of a D-type flip-flop). In a system (or operating) mode, the multiplexer 804 can be set such that the scan cell 800 acts like an ordinary sequential element (here, a D-type flip-flop). In FIG. 8, for example, this is accomplished by setting the signal on the scan-enable path (SE) to select the system-data path (D). During the shift-in or shift-out phase, the multiplexer 804 can be set such that the scan cell 800 operates in the so-called "scan mode" and forms one or more serially connected chains of sequential elements that input test-pattern data generated from a test pattern generator (e.g., a PRPG). In FIG. 8, for example, scan mode can be activated by setting the signal on the scan-enable path (SE) to select the scan-input path (SI) (also known as the test-pattern input path), thereby inputting test-pattern data from the test pattern generator or from an upstream scan cell into the scan cell 800. The sequential element's output (e.g., the Q output of a D-type flip-flop) outputs data onto a path that may branch into a system-data path (Q) and a scan path (S). The system-data path (Q) is ordinarily coupled to logic within the CUT. The scan path (S) typically becomes the scan-input path (SI) of a downstream scan cell or is output to an appropriate primary output or output analyzer of the CUT. In general, then, the scan path (S) is the path that carrying data through the scan chain.

To implement embodiments of the disclosed constrained-scan-cell architecture, one or more constrained scan cells can be utilized. A constrained scan cell can be constructed by adding test logic to the scan-input path of a conventional scan cell without affecting or modifying the functional circuit paths downstream of the scan cell. The test logic can be configured to logically combine the scan-chain data on the scan path with the signal on a scan-override path. The scan-override path typically carries a respective test phase trigger signal (e.g., phase_cntl1, phase_cntl2, or phase_cntl3) such that the corresponding scan cell is constrained to a specific value when the scan-override path has a particular value. Because the test logic is implemented in the scan paths, rather than within the CUT itself (as in the conventional MTPI architecture), it does not adversely impact timing during the functional operation of the CUT.

Figure 9:
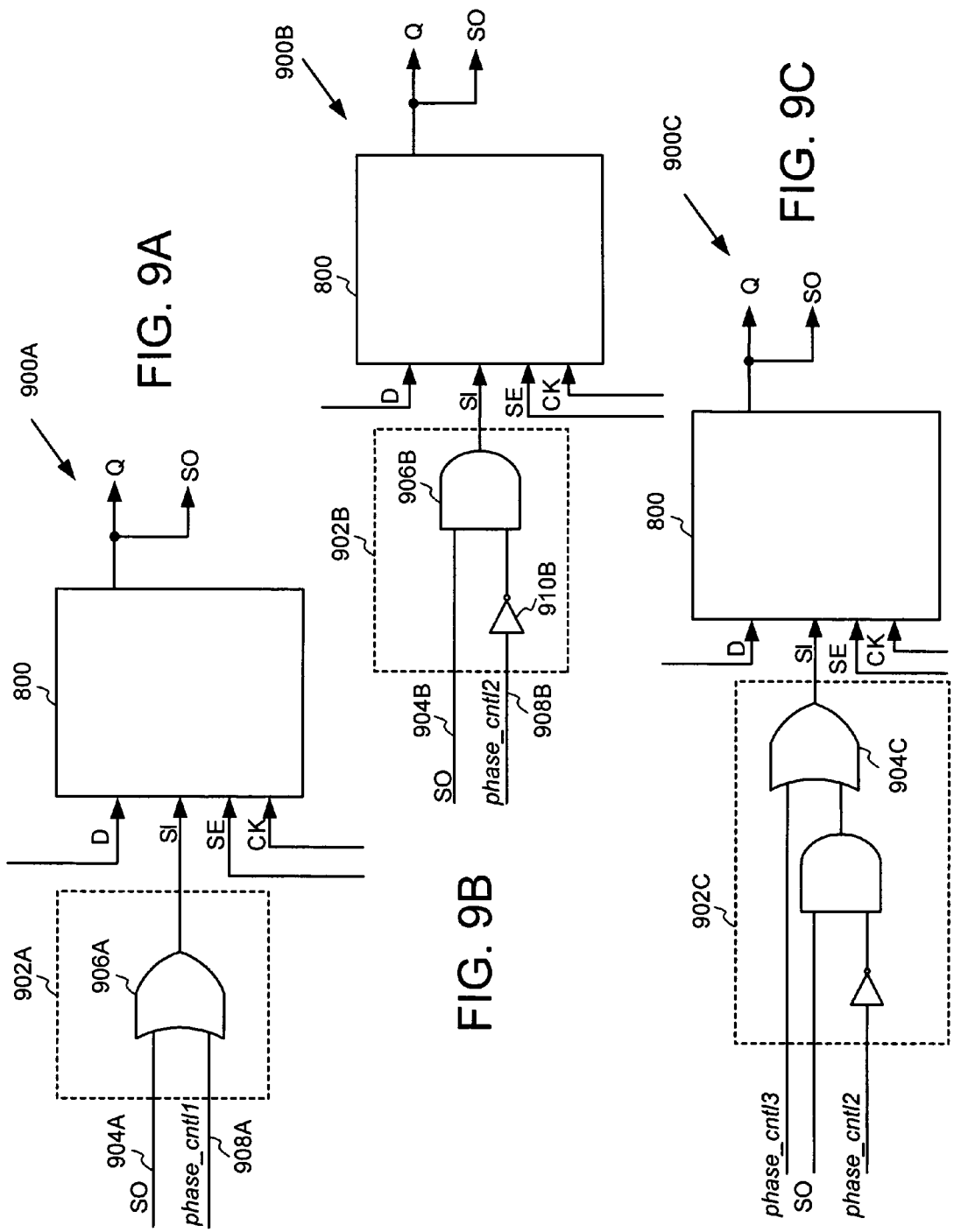
FIG. 9A is a block diagram illustrating a first embodiment of a constrained scan cell.
FIG. 9B is a block diagram illustrating a second embodiment of a constrained scan cell.
FIG. 9C is a block diagram illustrating a third embodiment of a constrained scan cell.

FIG. 9A shows a first exemplary type of constrained scan cell. For illustrative purposes only, the scan cells in FIGS. 9A-9C comprise MUX-D scan cells. It is understood, however, that other types of scan cell may also be used (e.g., scan cells constructed from latches or LSSD-based scan cells). In FIG. 9A, a test phase trigger signal (here, phase_cntl1) on a scan-override path 908A and scan-chain data on a scan path 904A (S) from a previous scan cell or a test pattern generator are logically combined at a gate 906A, which implements an OR function. The output of the gate 906A is the scan-input path (SI) (or test-pattern input path) for the conventional scan cell 800A. In the illustrated embodiment, the value of phase_cntl1 is "1" during the last shift of scan chain data loading in test phase 1, thereby forcing the value of the scan-input path (SI) to "1" no matter what the value of the scan path (S) is. Thus, phase_cntl1 overwrites the original test pattern value supplied by the test pattern generator. However, during all other test phases, phase_cntl1's value is "0", so the value of the scan path (S) is passed unchanged to the scan cell 800.

Likewise, as shown in FIG. 9B, when a "0" constraint is needed, test logic 902B may include an inverter 910B to invert the test phase trigger signal (here, phase_cntl2) on the scan-override path 908B and a gate 906B implementing the AND function. The inverted test phase trigger signal and the gate 906B force the value of the scan-input path (SI) to "0" when the test phase trigger signal has the value "1".

These constraints may also be alternatively implemented, such as by using other logical gate arrangements. Moreover, there are cases where it is desirable for a scan cell to have different constraints during different phases of a test. In such cases, for example, both AND and OR gates may be used, as shown in the exemplary embodiment of FIG. 9C. If a scan cell is to assume the same constraint through several phases of a test, corresponding phase-control signals may be, for example, ORed together in test logic 902C at a gate 904C that produces the scan-input path (SI) of the scan cell 800A. Moreover, the test phase trigger signal is not limited to the value "1", as illustrated here. These values and logic implementations should not be construed as limiting in any way, as the desired functionality and advantages of the disclosed architecture can be accomplished using architectures that operate with different values. All such variations, however, are considered to be within the scope of the present disclosure.

Figure 10:
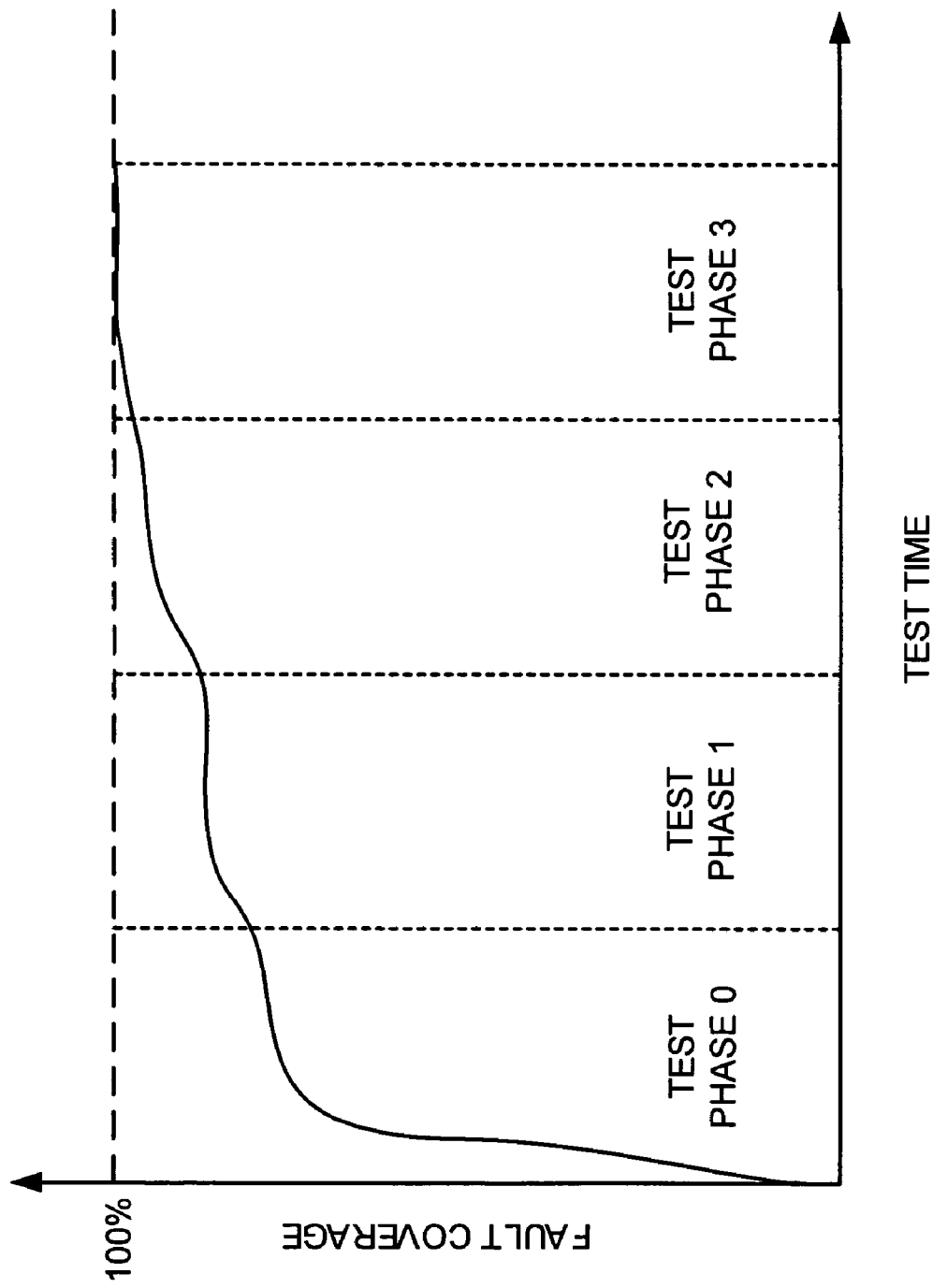
FIG. 10 is a graph of fault coverage of a four-phase test utilizing an embodiment of the disclosed architecture.

As compared to MTPI, the disclosed embodiments of the constrained-scan-cell architecture maintain the constructive nature of fault-coverage convergence while minimizing or eliminating performance degradation due to control-point insertion within the functional paths of the CUT. A fault-coverage plot of a typical 4-phase run of an exemplary embodiment of the disclosed architecture is shown in FIG. 10. Most easy-to-test faults discovered by pseudo-random patterns generated by the PRPG (e.g., an LFSR) are detected in test phase 0. Constrained scan cells are used in each of the subsequent phases to target subsets of pseudo-random-resistant faults.

V. Exemplary Embodiments of a Method for Selecting Observation Points and Constrained Scan Cells The selection of observation points and control points may be implemented in a constructive manner, similar to that of multi-phase test point insertion (MTPI). For example, any of the techniques disclosed in U.S. Pat. No. 6,070,261, which is incorporated herein by reference, may be utilized in whole or in part.

Figure 11:
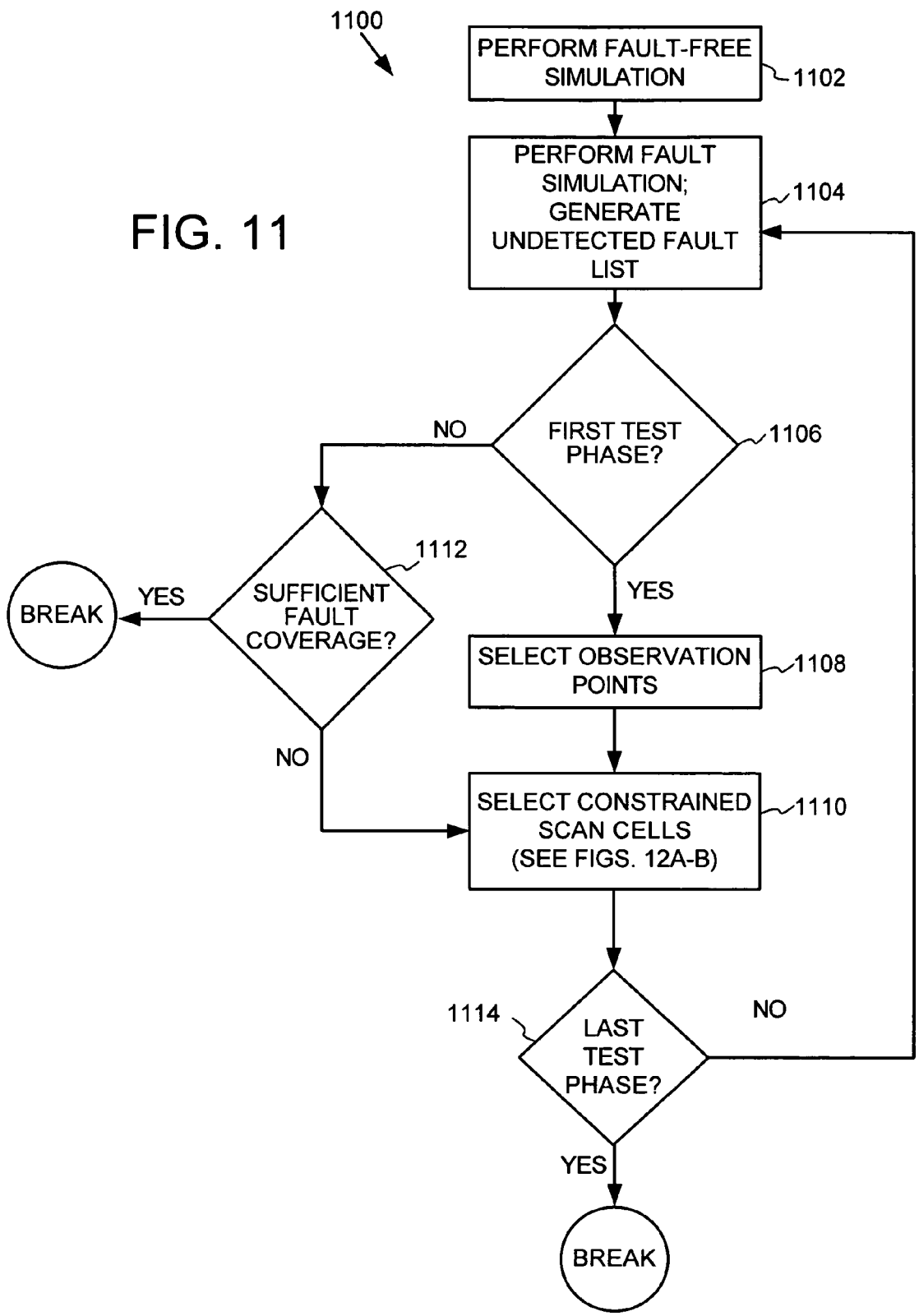
FIG. 11 is a flowchart illustrating an exemplary method for implementing constrained-scan-cell selection using some of the disclosed principles.

FIG. 11 is a flowchart of an exemplary general method 1100 for inserting observation points 1108 and constrained scan cells 1110 into an integrated circuit design utilizing the concepts discussed above. The method 1100 may be carried out by an EDA tool that is resident in a computer system (such as computer system 102) and may be implemented in software, hardware, or a combination of both. For example, an EDA tool may perform the disclosed method on an integrated circuit design comprising a representation of the integrated circuit stored in one or more data structures or databases on computer-readable media (e.g., a netlist or HDL file). The flowchart in FIG. 11 shows only one exemplary embodiment and should not be construed as limiting in any way.

The exemplary method 1100 shown in FIG. 11 receives as inputs a set of parameters, such as the number of random patterns, the number of phases, target-fault coverage, the maximum number of constrained scan cells per phase, and the maximum number of observation points, though many other inputs can also be used in alternative embodiments.

At process block 1102, a benchmark signature for the integrated circuit design is established by applying a number of test patterns to a logic simulation of the integrated circuit design to obtain the expected, fault-free response. At process block 1104, the test patterns are applied during fault simulations, and an undetected fault list is created that lists the faults undetected so far by the test patterns.

Figure 7:
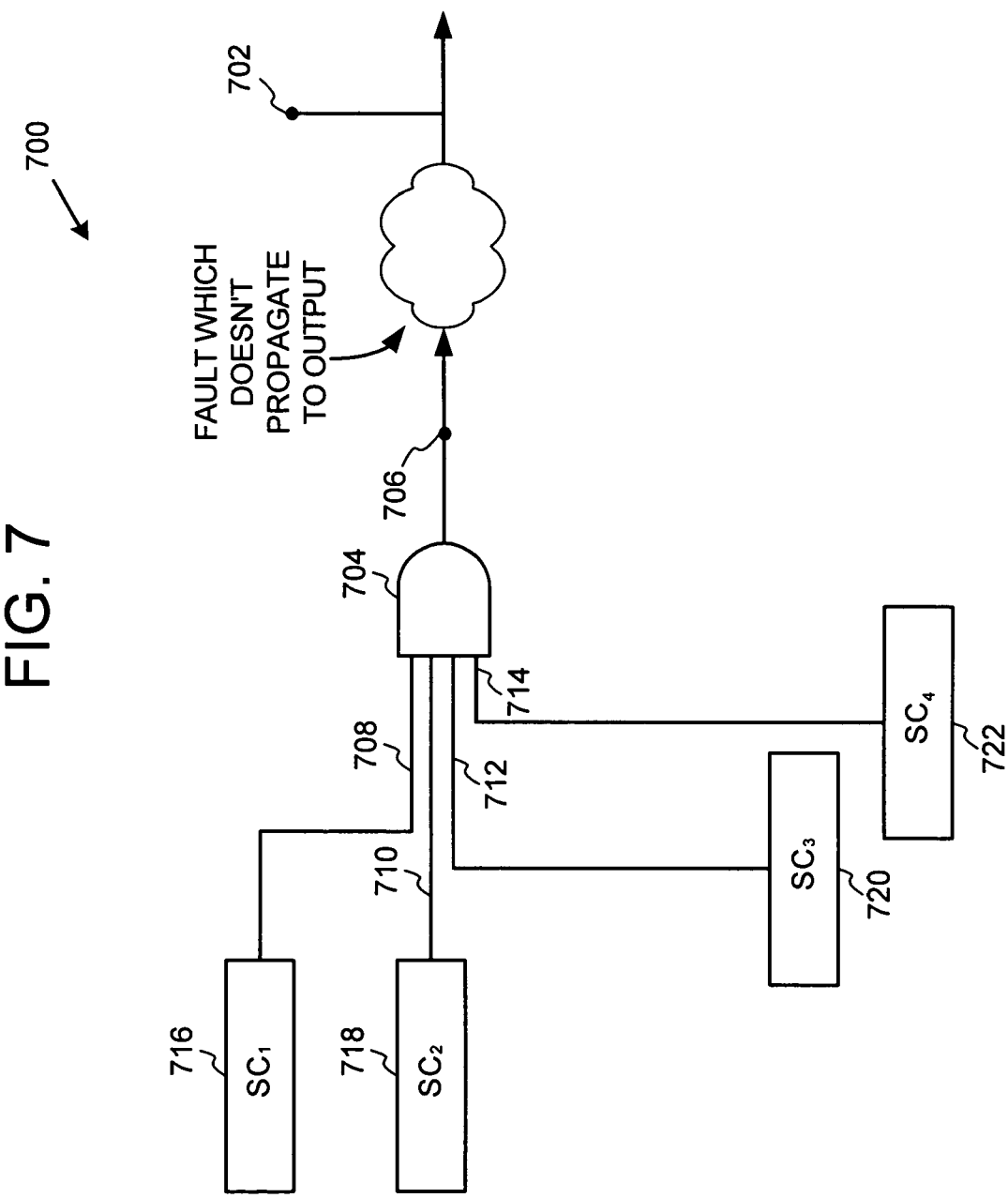
FIG. 7 is a block diagram illustrating a portion of the relationship of scan cells to logic within the CUT.

At process block 1106, it is determined if this is the first test phase; if so, then at process block 1108 observation points are selected. With reference to FIG. 7, observation points 702 allow the detection of faults, although they produce a pattern change within the CUT, whose fault pattern does not propagate to an output. In an exemplary embodiment, observation points are inserted by adding an output lead from the chosen location to a location where one or more faults are observable. Observation points are useful as not only do they often allow detection of otherwise-undetectable faults, but also have low overhead. Further, observation points typically influence circuit performance less than conventional control points inserted into the core logic of the CUT. In one embodiment, for instance, only one additional fan-out within the CUT is used to observe a node. An XOR tree may also be used to compact observation points and feed them into an existing scan cell or into a new scan cell. An exemplary XOR tree is described in V. S. Iyengar and D. Brand, "Synthesis of Pseudo-Random Pattern Testable Designs," *Proc. of Int'l Test Conf.*, pp. 501-508 (1989). Observation points are desirably, although not necessarily, enabled through all test phases.

In one exemplary embodiment of the method 1100, the "best" observation points are selected iteratively. The "best" observation point may defined as the one associated with the node at which the greatest number of faults can be seen with at least a user-defined detection probability (e.g., the detection threshold "DTh"). Other criteria can also be used to determine the "best" observation point. Observation points continue to be iteratively selected—the next-best observation point is located, and so on—until a selected observation point fails to meet a user-specified minimum-benefit-per-cost (MBPC) criterion. Other implementations may insert a set number of observation points based on DTh, or utilize different criteria.

If not at the first test phase, then, at process block 1112, using the undetected fault list generated at process block 1104, it is determined if current fault coverage is at or exceeds a user-defined target fault coverage. If so, then the method 1100 terminates. Otherwise, the method 1100 continues at process block 1110 where constrained scan cells are selected. At process block 1114, it is determined if there are still test phases left (e.g., according to a user-specified limit). If so, the current test phase is updated, and, as shown at process block 1104, fault simulation is again performed using all of the constrained scan cells and observation points selected up to this point to determine the list of still-undetected faults.

In one exemplary embodiment, the process of selecting constrained scan cells performed at process block 1110 involves iteratively selecting sets of constrained scan cells that can detect the most faults in the undetected fault list 1104. An exemplary embodiment of this process is further examined in the discussion accompanying FIGS. 12A and 12B.

In general, one of the objectives of the exemplary embodiment is to winnow the constrained-scan-cell candidates to a reasonable number of scan cells. Indeed, it is typically undesirable to list all scan cells as constrained-scan-cell candidates. For example, consider a modest design with 10,000 scan cells. As each scan cell in this illustration has two possible constraints ("0" or "1"), there will be a total of 2×10,000=20,000 constrained-scan-cell candidates, a number that is relatively large from a computing perspective. In the MTPI scheme, control points are selected sequentially; the best is found, then the second-best, and so on. One might consider doing the same thing in the constrained-scan-cell scheme, which can be conceptually viewed as using control points at the scan output of scan cells. A control point in MTPI, however, is a 1/0-failing node. When a control point is inserted, it will at least activate a stuck-at-1 or a stuck-at-0 fault at a control-point site, and will further facilitate propagation of the faults in the fan-in region of its parallel inputs. By contrast, when a single constrained scan cell is set, it is difficult for the constrained scan cell to facilitate detection of those hard-to-control or hard-to-observe faults.

For example, and with reference to FIG. 7, scan cells 716, 718, 720, and 722 (scan cells $SC_1$-$SC_4$) are used to control the value at control point 706. Only when all four scan cells output the value "1" into the input paths 708, 710, 712, and 714 of the node 704 will the value at the control point 706 be driven to "1".

Therefore, setting a single scan cell (e.g., $SC_1$) to "1" while leaving the other three scan cells unconstrained will have little chance of forcing the value of "1" at the control point 706, as it would require the other three scan cells (e.g., $SC_2$-$SC_4$) to all randomly be assigned "1"s by the test pattern generator. In a typical circuit design, there are many instances where several scan cells must be constrained simultaneously to produce the desired effect at the control point. Accordingly, it is typically undesirable to consider constrained scan cells one by one.

Instead, it is desirable to select scan cells in sets, known as "cubes" or "justification cubes", that can control the value of a specific control point. For example, with reference to FIG. 7, the four scan values "1, 1, 1, 1" make up the cube to produce the value "1" at the control point 706. Cube size is typically not constrained except by the nature of the fault patterns to be inserted into the CUT and the design of the CUT.

Figure 12A:
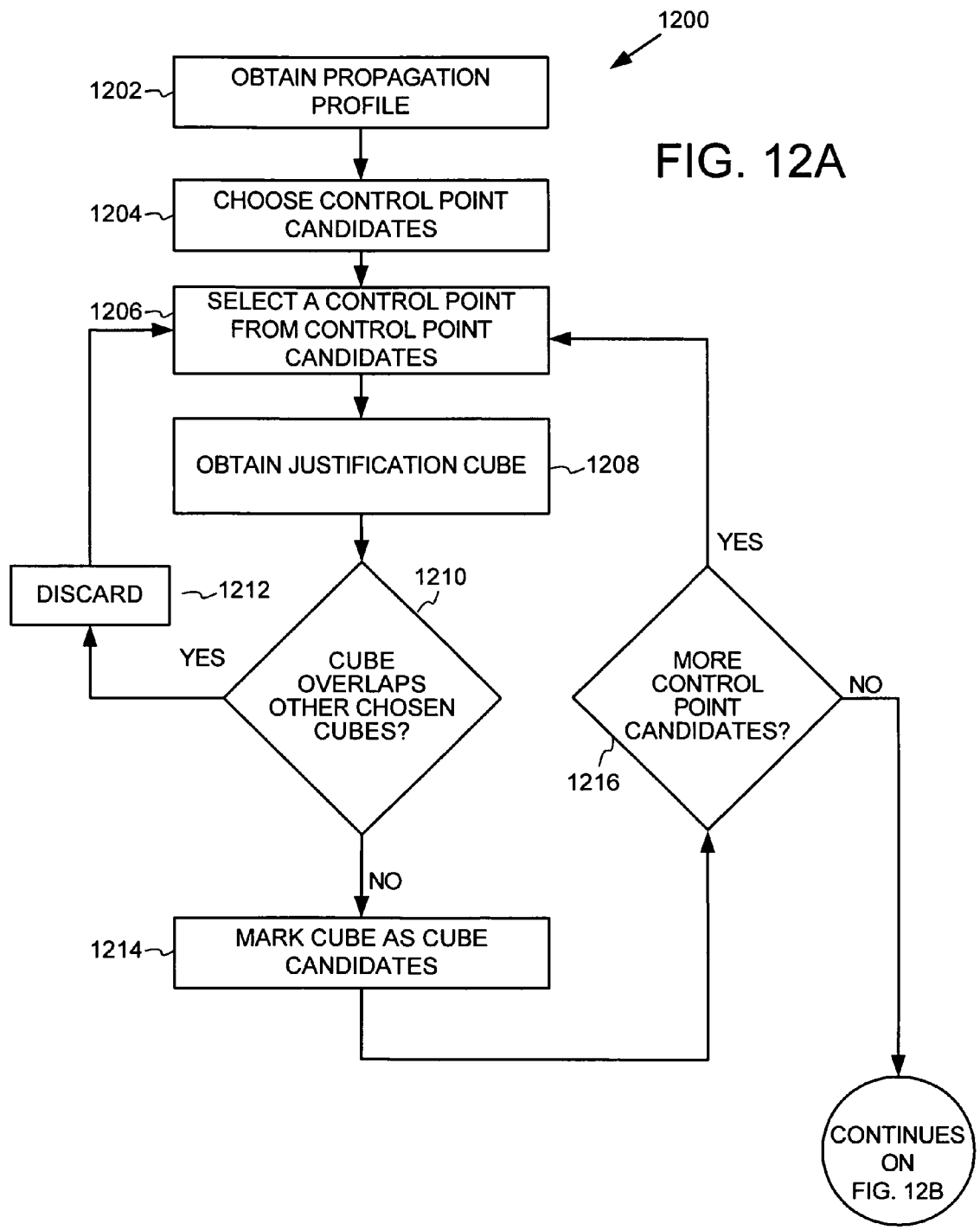
FIG. 12 is a flowchart illustrating an exemplary method for implementing constrained-scan-cell selection that extends some of the aspects of the methods shown in FIG. 11.
Figure 12B:
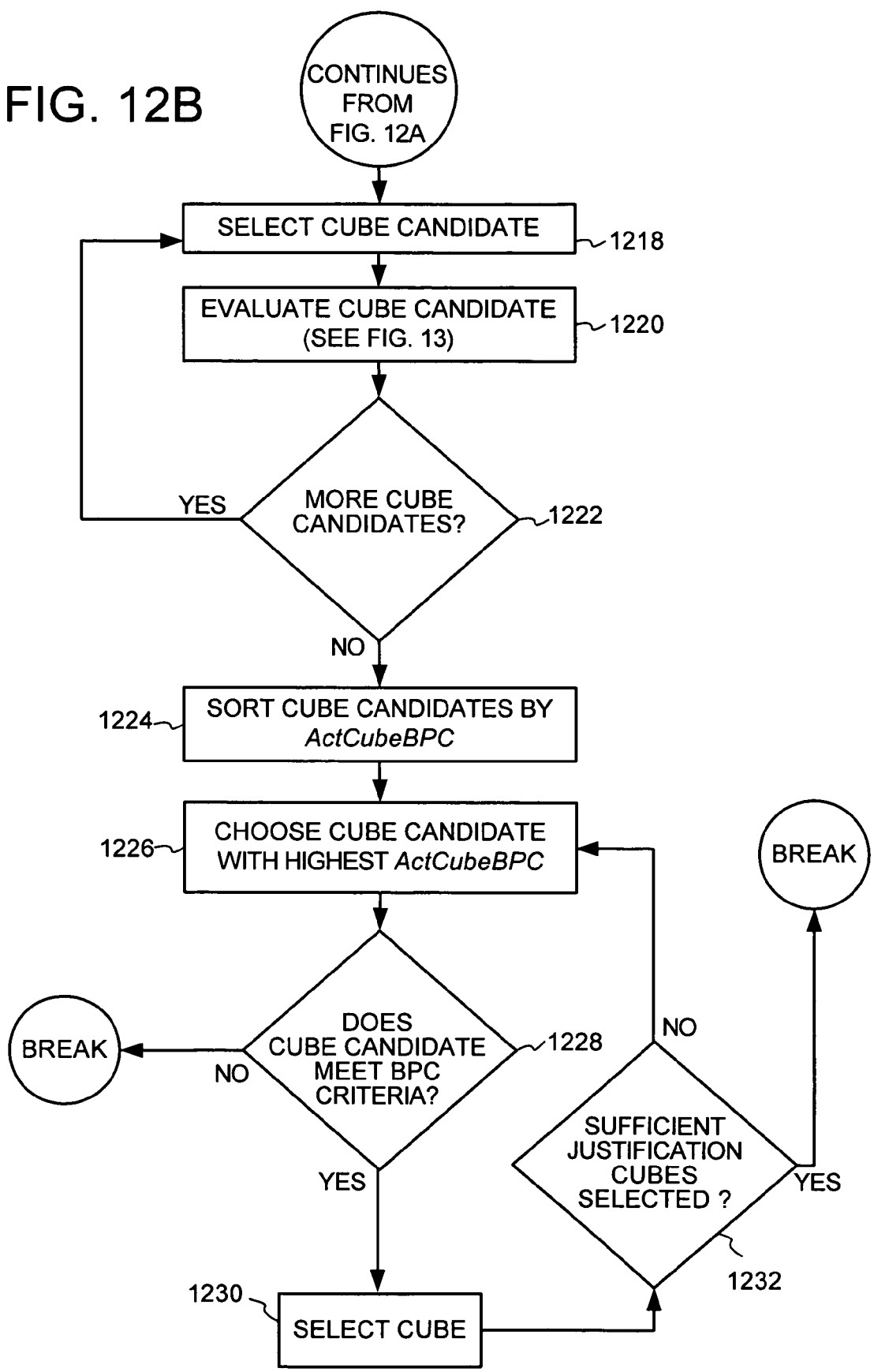

FIGS. 12A and 12B show an exemplary procedure for choosing constrained scan cells utilizing the concepts discussed above. The flowchart 1200 shows only one exemplary embodiment of implementing constrained-scan-cell selection and should not be construed as limiting in any way.

At process block 1202, probabilistic fault simulation is performed to obtain a propagation profile. Using the undetected fault list generated at process block 1104, probabalistic fault simulation computes for each node in the CUT a list of undetected faults that propagate to that node—each logic gate generally comprising a node. It also computes each fault's associated detection probability.

In some embodiments, probabilistic fault simulation is performed as follows: first, a pattern probability is determined; the pattern probability is based on the actual set of "0's" and "1's" that are propagated to each node and lists the successive values held by the node and how long each was held. From the pattern probability, the signal probabilities at the nodes of the CUT are computed. The signal probability is the percentage of time that a specific input to a node holds the values "1" and "0". For each fault on the undetected fault list and at the node associated with the fault, a variable is initialized to the signal probability of that node. Forward fault propagation is performed to find the detection probability of this fault at possible forward control nodes. For each node, the detection probability of each fault that can be observed at the node is summed to form a fault-detection value. When the fault-detection value at a node falls below a detection threshold, the forward fault propagation is halted. The value of the detection threshold can be determined by considering factors such as the phase duration and the desired detection confidence, and can be varied across different test phases. This detection probability information is referred to generally as the propagation profile.

At process block 1204, control-point candidates are chosen. In one exemplary embodiment, control point candidates with low controllability are chosen; that is, those nodes which require a specific set of values not generated by the pseudo-random patterns on their inputs to properly test them. With reference to FIG. 7, for example, the node 704 can be thought of as having low controllability because each of its four input paths 708, 710, 712, 714 must have the value "1" to drive its output value to "1". Another exemplary method chooses control point candidates by selecting 1/0-failing nodes with estimates E0/E1, which are greater than a minimum acceptable value.

At process block 1206, a control point candidate is selected from among the control point candidates. At process block 1208, a backward justification is performed to obtain one or more justification cubes for the selected control point candidate. Here, the term "justification" means determining the input values at upstream scan cells necessary to obtain a desired value at a given control point. For example, referring again to the circuit illustrated by block diagram 700 in FIG. 7, during a test phase, when the value "1" is inserted on each of the input paths 708, 710, 712, 714, to the AND gate node 704 upstream from the control point 706, the control point will be driven to the value "1" in a fault-free circuit. This has the effect of testing the AND condition of the node 704. The value "1" in each of the four scan cells 716, 718, 720, and 722 (scan cells $SC_1$-$SC_4$) forms the justification cube for control point 700. Justification as described above can be performed by a number of known methods.

At process block 1210, the set of scan cells within the cube are checked against current scan-cell constraints for overlap. If there is no overlap, at process block 1214, the cube is identified as a cube candidate (sometimes referred to herein as a "justification-cube candidate"); otherwise, as shown at process block 1212, it is discarded.

For a given control point, more than one possible justification cube might exist that can be used to drive the control point to a desired value. Thus, at process block 1206, multiple justification cubes may be determined. In certain embodiments of the disclosed technology, one of the possible justification cubes is chosen at random to be the justification cube evaluated at process block 1210. In other embodiments, however, multiple possible justification cubes for a given control point are evaluated at process block 1210 in order to select a justification cube that does not overlap with previously selected scan cell constraints for a specific test phase.

At process block 1216, a determination is made whether there are more control point candidates. If so, these candidates, in turn, obtain their justification cubes 1208 and are checked for overlap 1210. As a result, a number of cube candidates are determined that do not conflict with current scan-cell constraints. With reference to FIG. 12B, once all possible cube candidates are determined, at process block 1218, a cube candidate is selected, and at process block 1220 the cube candidate is evaluated to obtain its actual benefit, as is more thoroughly described in FIG. 13. This benefit is assessed by some predetermined procedure or evaluation parameter, and can be a parameter that indicates the detectability (or observability) of faults within the CUT when the scan-cell constraints of the cube candidate are set, or can be measured using some other method.

At process block 1222, it is determined if there are more cube candidates. If so, the process continues at process block 1218 with each cube candidate selected in turn and at process block 1220 where each cube candidate is evaluated.

Once all cube candidates have been evaluated, at process block 1224, the cube candidates are sorted by their evaluation values, known here as their ActCubeBPC (actual cube benefit parameter calculation). At process block 1226, the cube candidate with the highest ActCubeBPC is chosen. In process block 1228 it is determined if the cube candidate with the highest ActCubeBPC (or with a ActCubeBPC meeting a specified criteria) meets a benefit-per-cost criterion. If so, at process block 1230, it is selected, and the corresponding scan-cell constraints are added to the specific test design. In some embodiments, the ActCubeBPC criteria concerns locating the control point cube that produces the greatest number of faults that propagate to observable circuit locations. In an exemplary embodiment, if the cube candidate with the highest ActCubeBPC does not meet the BPC criteria, then the remaining justification cubes do not produce enough benefit to be included in the circuit under test, and so this test phase is considered completed.

At process block 1232, it is determined whether sufficient justification cubes have been selected for a given test phase. If so, the process breaks; if not, the process continues at process block 1226, as previously discussed. In some implementations, constrained scan cells are selected until a user-defined number or percentage of undetected faults has been detected. In other implementations a user-defined number of constrained scan cells is chosen for each phase. In yet other implementations, a combination of the above methods is employed. Those of skill in the art will discern other methods of selecting control points, justification cubes, and observation points.

Returning to FIG. 11, it should be noted that the procedure discussed in FIGS. 12A and 12B is repeated for each test phase, after updating the undetected fault list using a fault simulation wherein the just-selected scan cell constraints are activated. Thus, the fault simulation at process block 1104 incorporates all of the previously chosen constrained scan cells to arrive at a revised fault list that includes only those faults that have yet to be found. As can be seen with reference to FIG. 10, the fault coverage improves with each added test phase.

Figure 13:
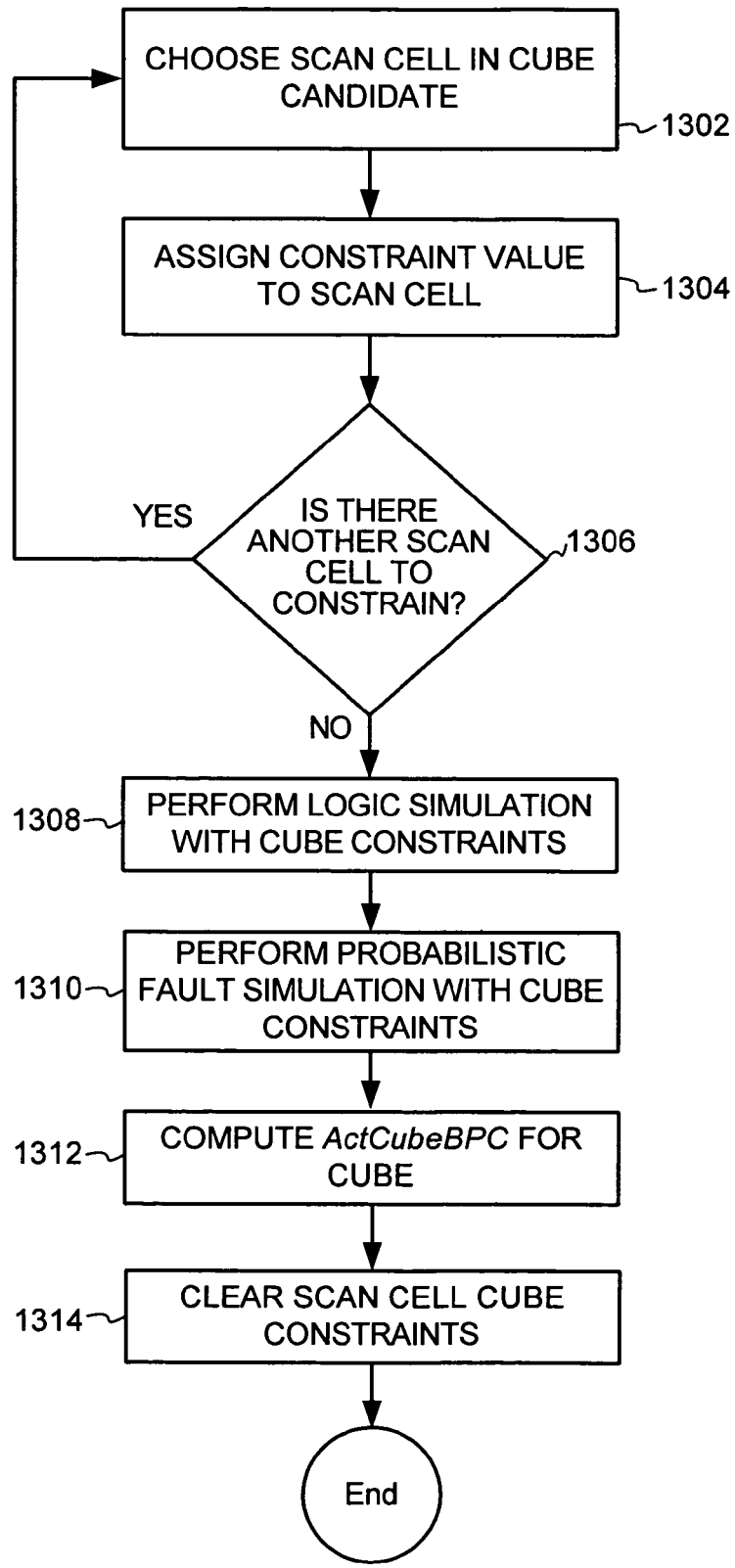
FIG. 13 is a flowchart illustrating an exemplary method for evaluating cube candidates that extends some of the aspects of the methods shown in FIGS. 11 and 12.

An exemplary method 1300 shown in the flowchart of FIG. 13 can be utilized to evaluate cube candidates as shown at process block 1220. The exemplary method 1300 represents a particular embodiment that expands the exemplary methods described above and should not be construed as limiting in any way. Instead, the method may be modified in arrangement and detail without departing from the scope of the disclosed technology. For example, certain acts described may be omitted in particular embodiments, and certain acts may be performed in an order different than that shown.

At process block 1302, a scan cell in the cube selected at process block 1220 is checked against previously assigned scan-cell constraints. At process block 1304, if the scan cell has not yet been constrained, a corresponding constraint value is assigned to the scan cell. This can be thought of conceptually as temporarily inserting test logic between the chosen scan cell and the appropriate test phase trigger signal. At process block 1306 it is determined if more scan cells in the cube candidate need to be constrained. If so, the process continues at process block 1302, repeating until all scan cells in the cube have been appropriately constrained. Otherwise, the process continues at process block 1308.

The usefulness of this cube is evaluated by determining which faults will be detected if it is used. At process block 1308, with the cube constraints in place, logic simulation of the circuit is performed using the current list of undetected faults. This obtains the signal and pattern probability under the scan-cell constraints. At process block 1310, probabilistic fault simulation is used to obtain a propagation profile which gives for each node the probability that a previously-undetected fault can now be found. One or more faults that have yet to be detected are simulated, and the probability that they will be detected at each node is determined. These individual detection probabilities at each node are summed so that the undetected fault has a single probability value that is the total chance in the CUT that the fault will be detected—the fault detection probability. In one desirable embodiment, this process is repeated for every fault on the undetected fault list. At process block 1312, the fault detection probability of each fault on the undetected fault list are themselves summed, giving a single value that represents the overall chance of this specific cube detecting any faults. This value is referred to here as the Actual Cube Benefit Property Calculation (ActCubeBPC).

At process block 1314, the scan-cell constraints assumed for the cube evaluation are cleared, and the evaluation of the selected cube candidate ends. Returning to FIG. 12B, it can be seen that each justification cube has its ActCubeBPC determined and that the justification cubes are selected based on their ActCubeBPC value.

In contrast to control-point-candidate evaluation in MTPI, it is not necessary to perform the analytical techniques that compute a signal-probability change or pattern-probability change in the fan-out region of the control point. Instead, these procedures can be replaced with logic simulation of a predetermined number of pseudo-random patterns. Even though the analytical techniques may, in some cases, be performed faster than logic simulation, the techniques are not accurate enough to reflect the signal-probability change in the fan-out region of a cube candidate. Indeed, the fan-out region of a cube candidate can be much larger than that of a control point in core logic, restricting the usefulness of the analytical technique. Certain embodiments of the disclosed method, however, may still use the analytical technique.

VI. Experimental Results

In this section, experimental results obtained from using an exemplary embodiment of the disclosed BIST methods are presented. The exemplary embodiment utilized in the tests was substantially identical to the methods presented in FIGS. 11-13 discussed above. The exemplary embodiment was applied to several pseudo-random-resistant ISCAS benchmark circuits and three large industrial designs. All test-coverage results are based on a single stuck-at fault model. In all experiments, 32,000 pseudo-random patterns were applied in order to obtain a fair comparison. For BIST schemes with multiple phases, the number of patterns in each phase was equally distributed. For instance, in a 4-phase BIST run, 8,000 patterns were allocated for each phase; while an 8-phase run utilized 4,000 patterns per phase.

Table 1 shows the results from five pseudo-random-resistant ISCAS benchmark circuits. For purposes of the tests conducted, it was assumed that boundary scan had been applied to the circuits so that data could be scanned into primary inputs and scanned out from primary outputs.

TABLE 1

Experimental Results for ISCAS Benchmarks

| | 32k pseudo-random | 32k, 4 ph | | | | 32k, 8 ph | | | |
| | | Exemplary BIST | | MTPI | | Exemplary BIST | | MTPI | |
| Circuit | F.E. | CPs/OBs | F.E. | CPs/OBs | F.E. | CPs/OBs | F.E. | CPs/OBs | F.E. |
|---|---|---|---|---|---|---|---|---|---|
| C2670 | 95.78 | 27/4 | 100.0 | 1/5 | 100.0 | — | — | — | — |
| C7552 | 97.67 | 34/11 | 99.52 | 7/11 | 99.53 | 61/11 | 99.58 | 8/11 | 99.55 |
| S9234 | 94.80 | 67/21 | 99.83 | 15/30 | 99.73 | 90/30 | 99.98 | 15/30 | 99.83 |
| S15850 | 97.84 | 167/30 | 99.94 | 17/30 | 99.89 | 202/30 | 99.90 | 17/30 | 99.87 |
| S38417 | 97.03 | 239/30 | 99.79 | 28/30 | 99.62 | 333/30 | 99.84 | 20/30 | 99.55 |

In Table 1, the second column lists the fault efficiency (F.E.) obtained from the 32,000 pseudo-random patterns tested. The following columns show both 4-phase and 8-phase BIST runs using the exemplary embodiment of the disclosed BIST scheme and MTPI. The composite number of constrained scan cells (or control points for MTPI) and the observation points are listed in subcolumns "CPs/OBs", while the corresponding fault efficiency is listed in subcolumns "F.E." As shown by Table 1, when the number of observation points is kept the same for the exemplary BIST scheme and MTPI, the exemplary BIST scheme can achieve comparable or higher fault efficiency than MTPI. However, the constrained-scan-cell count is much higher, which is to be expected as multiple constrained scan cells are often set to produce a desired fault test value. Table 1 also shows that the number of observation points for c2670 and s9234 is not equal for the exemplary BIST scheme and MTPI in the 4-phase run, even though the same number of observation points was asked for in both schemes. This variance was caused by using a slightly modified version of the observation-point-selection method when computing the observation points for the MTPI run. A similar result was observed with the industrial designs. For all ISCAS benchmark circuits, the ATPG fault efficiency was at or near 100%, indicating that the exemplary BIST scheme is able to achieve ATPG or near-ATPG coverage.

Table 2 shows the results from three large industrial designs.

in the eleventh column, with nonzero observation points, MTPI had 97.08% fault efficiency for the first independent run (IND1) versus 96.97% for the exemplary BIST scheme, as shown in column 10. For the second independent run, MTPI's fault efficiency was 97.97%, while the exemplary embodiment showed a fault efficiency of 97.78%. The third independent run gave a fault efficiency of 98.25% for the MTPI procedure, while the exemplary embodiment had a fault efficiency of 98.23%. These differences are quite small, amounting to 0.11%, 0.19%, and 0.02%, respectively. For

TABLE 2

Comparison of Different Schemes on Industrial Circuits

| Circuits | Gates | SCs | PIs | POs | 32k p. rand F.E. | ATPG F.E. | 32k, 4 ph | | 32k, 8 ph | |
| --- | --- | --- | --- | --- | --- | --- | --- | --- | --- | --- |
| | | | | | | | Exemplary F.E. (cost) | MTPI F.E. (cost) | Exemplary F.E. (cost) | MTPI F.E. (cost) |
| IND1 | 24,424 | 503 | 58 | 109 | 93.23 | 97.17 | 96.71 (54/100) | 97.01 (26/100) | 96.97 (68/100) | 97.08 (30/100) |
| IND2 | 103,682 | 5,638 | 322 | 531 | 92.88 | 98.17 | 97.40 (191/200) | 97.92 (122/200) | 97.78 (414/200) | 97.97 (152/200) |
| IND3 | 410,880 | 10,821 | 930 | 964 | 93.58 | 99.54 | 97.93 (492/527) | 98.17 (117/558) | 98.23 (898/800) | 98.25 (136/800) |

The second through the fifth columns of Table 2 list basic information concerning the industrial designs. In particular, the second column is a gate count, which ranges from about 24,000 to about 410,000; the third column is the number of scan cells from about 500 to about 10,000; and the fourth and fifth columns are the number of primary inputs and primary outputs, respectively. The fault efficiency (F.E.) obtained from the 32,000 pseudo-random patterns is given in the sixth column. The seventh column indicates ATPG Fault Efficiency with a BIST constraint. Specifically, when performing a built-in self test, X sources have to be bounded in order to avoid unknown states. Thus, in order to generate test patterns that were applicable in the BIST environment, this same constraint was applied to ATPG test generation. Moreover, the F.E. obtained by ATPG with the BIST constraint is indicative of the upper bound of BIST coverage. Columns eight and ten show F.E.'s and costs for a 32,000 pattern 4-phase and 8-phase run, respectively, using the exemplary BIST scheme. The cost inside the parentheses is a composite value of constrained scan cells (or control points for MTPI) and observation points. For comparison, the ninth and eleventh columns list the results from corresponding 4-phase and 8-phase runs using MTPI. Due to an updated version of the observation point selection method, the number of observation points produced by the exemplary embodiment is slightly lower than that of MTPI even though the same number of control points were requested at the start of the procedure.

Compared to the same size of 32,000-pseudo-random-pattern testing, the exemplary BIST scheme is able to improve fault efficiency by 4% to 5% using nonzero observation points. For all three designs, coverage can be improved by increasing the number of phases. However, more constrained scan cells (and thus more phase-control signals) are required to achieve the coverage gain, indicating a tradeoff between better coverage and less hardware overhead. It can also be observed from Table 2 that, in some instances, MTPI performs slightly better than the exemplary BIST scheme. For example, in the 8-phase BIST run, shown the biggest design, IND3, which has more than 400,000 gates, the coverage difference between the two schemes is only 0.02%.

One possible reason MTPI has slightly higher test coverage than the exemplary BIST scheme is that by inserting control points into the core logic, MTPI is able to perturb the fault list and make some redundant faults testable. As to hardware overhead, Tables 1 and 2 indicate that when the number of observation points is set the same for both MTPI and the exemplary BIST scheme, the number of constrained scan cells used in the exemplary BIST scheme is about 2 to 7 times that of the number of control points use in MTPI. For IND1, for example, when 100 observation points are used in a 4-phase BIST run, the ratio of constrained scan cells in the exemplary BIST scheme to control points in the MTPI scheme is 54 to 26. This ratio becomes 898 to 136 for IND3 when 800 observation points are used in an 8-phase run. This large constrained-scan-cell-to-control-point ratio, however, only results in an increase of 762 constrained scan cells (898−136=762), which accounts for only 0.18% of the total 410,000 gates. Thus, even though the exemplary BIST scheme may result in additional BIST hardware, the increase is within an acceptable range.

To examine whether the exemplary BIST scheme provides improved test coverage, test generation was performed with BIST constraints. The results of ATPG testing are listed in the seventh column of Table 2 and indicate an upper bound of BIST coverage. For IND1, fault efficiency obtained by the ATPG method was 97.17%, whereas the fault efficiency for the exemplary BIST scheme was 96.97%; for IND2, ATPG was 98.17%, whereas the exemplary BIST scheme was 97.78%; and for IND3, ATPG was 99.54%, whereas the exemplary BIST scheme was 98.23%. These results indicate that the exemplary BIST scheme is able to achieve close to ATPG coverage with acceptable hardware overhead.

VII. Exemplary Network Environments

Any of the aspects of the technology described above may be performed or designed using a distributed computer network. FIG. 14 shows one such exemplary network. A server computer 1400 can have an associated storage device 1402 (internal or external to the server computer). For example, the server computer 1400 can be configured to design constrained-scan-cell components according to any of the embodiments described above (e.g., as part of an EDA software tool, such as a design, verification, or simulation tool). The server computer 1400 may be coupled to a network, shown generally at 1404, which can comprise, for example, a wide-area network, a local-area network, a client-server network, the Internet, or other such network. One or more client computers, such as those shown at 1406, 1408, may be coupled to the network 1404 using a network protocol. The work may also be performed on a single, dedicated workstation, which has its own memory and one or more CPUs.

FIG. 15 shows that a database containing design information (e.g., a netlist or an HDL database) may be updated to include design information for a constrained-scan-cell architecture according to any of the embodiments disclosed herein using a remote server computer, such as the server computer 1400 shown in FIG. 14. In process block 1502, for example, the client computer sends design data relating to a circuit having one or more constrained scan cells to be tested using any of the disclosed testing methods and/or using any of the disclosed constrained-scan-cell architectures. For instance, the client computer may send a netlist or other EDA design database. In process block 1504, the design data is received and loaded by the server computer. In process block 1506, the circuit defined by the design data is updated to include a BIST architecture according to any of the disclosed embodiments. New design data representing the updated circuit design can then be created. This new design data can be stored, for example, as an updated version of the design database or as one or more separate databases. In process block 1508, the server computer sends the updated design data to the client computer, which receives the updated data in process block 1510. It should be apparent to those skilled in the art that the example shown in FIG. 15 is not the only way to update a design database to include the relevant design data. For instance, the design data may be stored on a computer-readable medium that is not on a network and that is sent separately to the server. Or, the server computer may perform only a portion of the design procedures.

Having illustrated and described the principles of the illustrated embodiments, it will be apparent to those skilled in the art that the embodiments can be modified in arrangement and detail without departing from such principles. For example, in one embodiment, one or more functional paths in the core of the CUT utilize constrained scan cells, whereas the remainder of the core logic utilizes test points under an MTPI scheme. Further, many of the software aspects of the embodiment may be implemented in hardware, and many of the hardware aspects may be implemented in software. Also, many of the disclosed methods can be arranged in a different order to achieve the same end result. Those skilled in the art will recognize that the disclosed embodiments can be easily modified to accommodate different situations and structures.

In view of the many possible embodiments, it will be recognized that the illustrated embodiments include only examples and should not be taken as a limitation on the scope of the invention. Rather, the invention is defined by the following claims. We therefore claim as the invention all such embodiments and their equivalents that come within the scope of these claims.

We claim:

1. A method, comprising:
   selecting a control point in an integrated circuit design, the control point comprising a location in the integrated circuit design that activates a fault when the control point has a desired test value;
   identifying two or more scan cells in the integrated circuit design that propagate the desired test value to the control point when the two or more scan cells are loaded with respective fault-activating values
   modifying the integrated circuit design to include circuit components configured to simultaneously load the identified two or more scan cells in the integrated circuit design with their respective fault-activating values during one or more test phases, the circuit components comprising logic in the scan-in paths of the one or mores scan cells; and
   storing the modified integrated circuit design.

2. The method of claim 1, wherein paths used during regular functional operation of the integrated circuit design are unchanged after the modification.

3. The method of claim 1, wherein the act of identifying the two or more scan cells comprises justifying the control point to at least one of the two or more scan cells.

4. The method of claim 1, wherein the act of selecting the control point comprises:
   performing probabilistic fault simulation of the integrated circuit design; and
   identifying one or more nodes in the integrated circuit design where fault coverage is below a selected threshold; and
   designating an output of one of the identified nodes as the control point.

5. The method of claim 4, wherein one or more pseudo-random test patterns are applied during the probabilistic fault simulation.

6. The method of claim 1, wherein the fault-activation values comprise a justification cube, the method further comprising:
   identifying multiple justification cube candidates for propagating the desired test value to the control point;
   for a selected justification-cube candidate, calculating a performance parameter indicative of the fault detection probability of the selected justification-cube candidate; and
   evaluating the selected justification-cube candidate based at least in part on the performance parameter.

7. The method of claim 6, wherein the act of calculating the performance parameter for the selected justification-cube candidate comprises:
   obtaining a signal and pattern probability associated with the selected justification-cube candidate by simulating faults in the integrated circuit design while applying the selected justification-cube candidate to corresponding scan cells;
   using the signal and pattern probability to obtain a propagation profile indicative of the selected justification-cube candidate's ability to locate faults; and
   calculating the performance parameter using the propagation profile.

8. The method of claim 1, wherein the fault-activation values comprise a first justification cube, wherein the control point is a first control point, and wherein the desired test value is a first desired test value, the method further comprising, evaluating whether the first justification cube overlaps with a second justification cube used to propagate a second desired test value to a second control point.

9. The method of claim 1, further comprising identifying at least one observation point in the integrated circuit design indicative of an upstream fault value.

10. One or more computer-readable media storing an integrated circuit design modified by the method of claim 1.

11. One or more computer-readable media storing computer-executable instructions for causing a computer system to perform the method of claim 1.

12. A method, comprising:
selecting a control point in an integrated circuit design, the control point comprising a location in the integrated circuit design that activates a fault when the control point has a desired test value;
identifying one or more scan cells in the integrated circuit design that propagate the desired test value to the control point when the one or more scan cells are loaded with a justification cube comprising a set of one or more values, the act of identifying the one or more scan cells comprising,
identifying multiple justification cube candidates for propagating the desired test value to the control point;
for a selected justification-cube candidate, calculating a performance parameter indicative of the fault detection probability of the selected justification-cube candidate; and
evaluating the selected justification-cube candidate based at least in part on the performance parameter;
modifying the integrated circuit design to include circuit components configured to load the identified one or more scan cells in the integrated circuit design with the set of one or more values during one or more test phases; and
storing the modified integrated circuit design.

13. The method of claim 12, wherein paths used during regular functional operation of the integrated circuit design are unchanged after the modification.

14. The method of claim 12, wherein the act of selecting the control point comprises:
performing probabilistic fault simulation of the integrated circuit design;
identifying one or more nodes in the integrated circuit design where fault coverage is below a selected threshold; and
designating an output of one of the identified nodes as the control point.

15. The method of claim 14, wherein one or more pseudo-random test patterns are applied during the probabilistic fault simulation.

16. The method of claim 12, wherein the act of calculating the performance parameter for the selected justification-cube candidate comprises:
obtaining a signal and pattern probability associated with the selected justification-cube candidate by simulating faults in the integrated circuit design while applying the selected justification-cube candidate to corresponding scan cells;
using the signal and pattern probability to obtain a propagation profile indicative of the selected justification-cube candidate's ability to locate faults; and
calculating the performance parameter using the propagation profile.

17. The method of claim 12, wherein the justification cube is a first justification cube, wherein the control point is a first control point, and wherein the desired test value is a first desired test value, the method further comprising,
evaluating whether the first justification cube overlaps with a second justification cube used to propagate a second desired test value to a second control point.

18. The method of claim 12, further comprising identifying at least one observation point in the integrated circuit design indicative of an upstream fault value.

19. One or more computer-readable media storing an integrated circuit design modified by the method of claim 12.

20. One or more computer-readable media storing computer-executable instructions for causing a computer system to perform the method of claim 12.

21. A method, comprising:
selecting a first control point in an integrated circuit design, the first control point comprising a location in the integrated circuit design that activates a fault when the first control point has a first desired test value;
identifying one or more scan cells in the integrated circuit design that propagate the first desired test value to the first control point when the one or more scan cells are loaded with a first justification cube comprising a set of one or more values;
evaluating whether the first justification cube overlaps with a second justification cube used to propagate a second desired test value to a second control point;
modifying the integrated circuit design to include circuit components configured to load the identified one or more scan cells in the integrated circuit design with the first justification cube during one or more test phases; and
storing the modified integrated circuit design.

22. The method of claim 21, wherein paths used during regular functional operation of the integrated circuit design are unchanged after the modification.

23. The method of claim 21, wherein the act of selecting the first control point comprises:
performing probabilistic fault simulation of the integrated circuit design;
identifying one or more nodes in the integrated circuit design where fault coverage is below a selected threshold; and
designating an output of one of the identified nodes as the first control point.

24. The method of claim 23, wherein one or more pseudo-random test patterns are applied during the probabilistic fault simulation.

25. The method of claim 21, further comprising:
identifying multiple justification cube candidates for propagating the desired test value to the first control point;
for a selected justification-cube candidate, calculating a performance parameter indicative of the fault detection probability of the selected justification-cube candidate; and
evaluating the selected justification-cube candidate based at least in part on the performance parameter.

26. The method of claim 25, wherein the act of calculating the performance parameter for the selected justification-cube candidate comprises:
obtaining a signal and pattern probability associated with the selected justification-cube candidate by simulating faults in the integrated circuit design while applying the selected justification-cube candidate to corresponding scan cells;

using the signal and pattern probability to obtain a propagation profile indicative of the selected justification-cube candidate's ability to locate faults; and calculating the performance parameter using the propagation profile.

27. The method of claim 21, further comprising identifying at least one observation point in the integrated circuit design indicative of an upstream fault value.

28. One or more computer-readable media storing an integrated circuit design modified by the method of claim 21.

29. One or more computer-readable media storing computer-executable instructions for causing a computer system to perform the method of claim 21.

* * * * *